United States Patent
Tominari et al.

(10) Patent No.: US 12,170,328 B2
(45) Date of Patent: Dec. 17, 2024

(54) P TYPE GALLIUM NITRIDE CONFORMAL EPITAXIAL STRUCTURE OVER THICK BUFFER LAYER

(71) Applicant: Texas Instruments Incorporated, Dallas, TX (US)

(72) Inventors: Tatsuya Tominari, Plano, TX (US); Nicholas Stephen Dellas, Dallas, TX (US); Qhalid Fareed, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 97 days.

(21) Appl. No.: 17/121,992

(22) Filed: Dec. 15, 2020

(65) Prior Publication Data

US 2022/0190148 A1    Jun. 16, 2022

(51) Int. Cl.
| | |
|---|---|
| H01L 29/778 | (2006.01) |
| H01L 29/04 | (2006.01) |
| H01L 29/20 | (2006.01) |
| H01L 29/205 | (2006.01) |
| H01L 29/66 | (2006.01) |

(52) U.S. Cl.
CPC ........ *H01L 29/7786* (2013.01); *H01L 29/045* (2013.01); *H01L 29/2003* (2013.01); *H01L 29/205* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 9,978,589 B2 | 5/2018 | Han et al. | |
| 9,978,845 B2 | 5/2018 | Han et al. | |
| 10,580,931 B2 | 3/2020 | Robin et al. | |
| 2009/0090984 A1* | 4/2009 | Khan | H01L 29/66462 |
| | | | 257/E21.24 |

(Continued)

OTHER PUBLICATIONS

Anderson, T. "An AlN/Ultrathin AlGaN/GaN HEMT structure Enhancement-Mode Operation using Selective Etching" IEEE Elec. Dev. Lett. vol. 30, No. 12 Dec. 2009 pp. 1251-1253 (Year: 2009).*

(Continued)

*Primary Examiner* — Grant S Withers
(74) *Attorney, Agent, or Firm* — Yudong Kim; Frank D. Cimino

(57) ABSTRACT

A semiconductor device includes a GaN FET on a silicon substrate and a buffer layer of III-N semiconductor material, with a columnar region, a transition region surrounding the columnar region, and an inter-columnar region around the transition region. The columnar region is higher than the inter-columnar region. The GaN FET includes a gate of III-N semiconductor material with a thickness greater than twice the vertical range of the top surface of the buffer layer in the columnar region. A difference between the gate thickness over the columnar region and over the transition region is less than half of the vertical range of the top surface of the buffer layer in the columnar surface. The semiconductor device may be formed by forming a gate layer of III-N semiconductor material over the barrier layer by a gate MOVPE process using a carrier gas that includes zero to 40 percent hydrogen gas.

17 Claims, 15 Drawing Sheets

(56) References Cited

U.S. PATENT DOCUMENTS

| | | | | |
|---|---|---|---|---|
| 2011/0233521 | A1* | 9/2011 | Saxler | H01L 33/24 |
| | | | | 257/618 |
| 2012/0326165 | A1* | 12/2012 | Nakata | H01L 21/02378 |
| | | | | 257/77 |
| 2015/0021616 | A1* | 1/2015 | Lee | H01L 29/7787 |
| | | | | 257/76 |
| 2020/0403090 | A1* | 12/2020 | Lin | H01L 29/41766 |

OTHER PUBLICATIONS

Dikme, Y. "Si(111) as alternative substrate for AlGaN/GaN HEMT" phys. Stat. sol. (c) 0 No. 7, Nov. 18, 2003 pp. 2385-2388 (Year: 2003).*

Hu, X. "Enhancement mode AlGaN/GaN HFET with selectively grown pn junction gate" Elec. Lett. May 2000 pp. 753-754 (Year: 2000).*

Corekci, S. "Characterization of an AlN buffer layer and a thick-GaN layer grown on sapphire substrate by MOCVD" J. Mater. Sci Oct. 23, 2010 pp. 1606-1612 (Year: 2010).*

Fujii, T. "High drain current and low on resistance normally-off-mode AlGaN/GaN junction HFETs with a p-type GaN gate contact" phys. stat. sol. (c) 5, No. 6, Apr. 25, 2008 pp. 1906-1909 (Year: 2008).*

D. Buttari, et al., Selective dry etching of GaN over AlGaN in BCl3/SF6 mixtures, Proceedings. IEEE Lester Eastman Conference on High Performance Devices, 2004.

Han, et al., Highly Selective Dry Etching of GaN over AlGaN Using Inductively Coupled Cl2/N2/O2 Plasmas, Japanese Journal of Applied Physics, vol. 42 (2003) Pt. 2, No. 10A.

Lundin, et al., Influence of the Carrier Gas Composition on Metalorganic Vapor Phase Epitaxy of Gallium Nitride, Technical Physics Letters, vol. 31, No. 4, 2005, pp. 293-294. Translated from Pis'ma v Zhurnal Tekhnichesko I Fiziki, vol. 31, No. 7, 2005, pp. 51-55.

Cho, et al., Effect of carrier gas on GaN epilayer characteristics, phys. stat. sol. (c) 3, No. 6 (2006).

* cited by examiner

P TYPE GALLIUM NITRIDE CONFORMAL EPITAXIAL STRUCTURE OVER THICK BUFFER LAYER

FIELD

This disclosure relates to the field of semiconductor devices. More particularly, but not exclusively, this disclosure relates to gallium nitride transistors in semiconductor devices.

BACKGROUND

Gallium nitride field effect transistors (GaN FETs) may be used to switch high voltages, higher than 500 volts. GaN FETs are commonly fabricated on epitaxial layers of III-N semiconductor material grown on silicon substrates, because silicon substrates are less expensive than other substrates, such as silicon carbide, or gallium nitride. A buffer layer of III-N semiconductor material is grown on a silicon substrate, with varying stoichiometry to match the silicon lattice on the silicon substrate surface, and transitioning to gallium nitride at a top surface of the buffer layer, suitable for forming the GaN FET. For GaN FETs designed to operate above several hundred volts, the buffer layer is several microns thick, to isolate the GaN FET from the silicon substrate.

SUMMARY

The present disclosure introduces a semiconductor device that includes a gallium nitride field effect transistor (GaN FET). The semiconductor device has a silicon substrate and a buffer layer of III-N semiconductor material over the silicon substrate, extending to a top surface of the buffer layer. The buffer layer includes a columnar region, a transition region surrounding the columnar region, and an inter-columnar region around the transition region, outside of the columnar region. The columnar region is higher than the inter-columnar region, by at least 50 nanometers. The columnar region has a lateral width of 50 microns to 100 microns. The top surface of the buffer layer in the columnar region has a vertical range less than 30 nanometers. The transition region has a lateral width of 5 microns to 40 microns. The top surface of the buffer layer in the transition region extends from the columnar region to the inter-columnar region, and has a vertical range greater than 50 nanometers. The GaN FET extends across at least a portion of the columnar region and at least a portion of the transition region.

The GaN FET includes a barrier layer of III-N semiconductor material over the buffer layer. The barrier layer extends over the portions of the columnar region and the transition region. The GaN FET further includes a gate of III-N semiconductor material over the barrier layer. The gate extends over the portions of the columnar region and the transition region. The gate has a lower aluminum content than the barrier layer. The gate has a gate thickness that is greater than twice the vertical range of the top surface of the buffer layer in the columnar region. A difference between the gate thickness over the columnar region and the gate thickness over the transition region is less than half of the vertical range of the top surface of the buffer layer in the columnar surface.

The semiconductor device may be formed by forming the buffer layer over the silicon substrate, and forming the barrier layer over the top surface by a barrier MOVPE process. A gate layer is formed of III-N semiconductor material over the barrier layer by a gate MOVPE process using a gallium-containing gas reagent, a nitrogen-containing gas reagent, and a carrier gas. The carrier gas includes zero to 40 percent hydrogen gas by volumetric flow rate. The gate layer extends over the columnar region and the transition region. The gate layer has a gate layer thickness that is greater than twice the vertical range of the top surface of the buffer layer in the columnar surface. A difference between the gate layer thickness over the columnar region and the gate layer thickness over the transition region is less than half of the vertical range of the top surface of the buffer layer in the columnar surface.

DETAILED DESCRIPTION

Figure 1A:
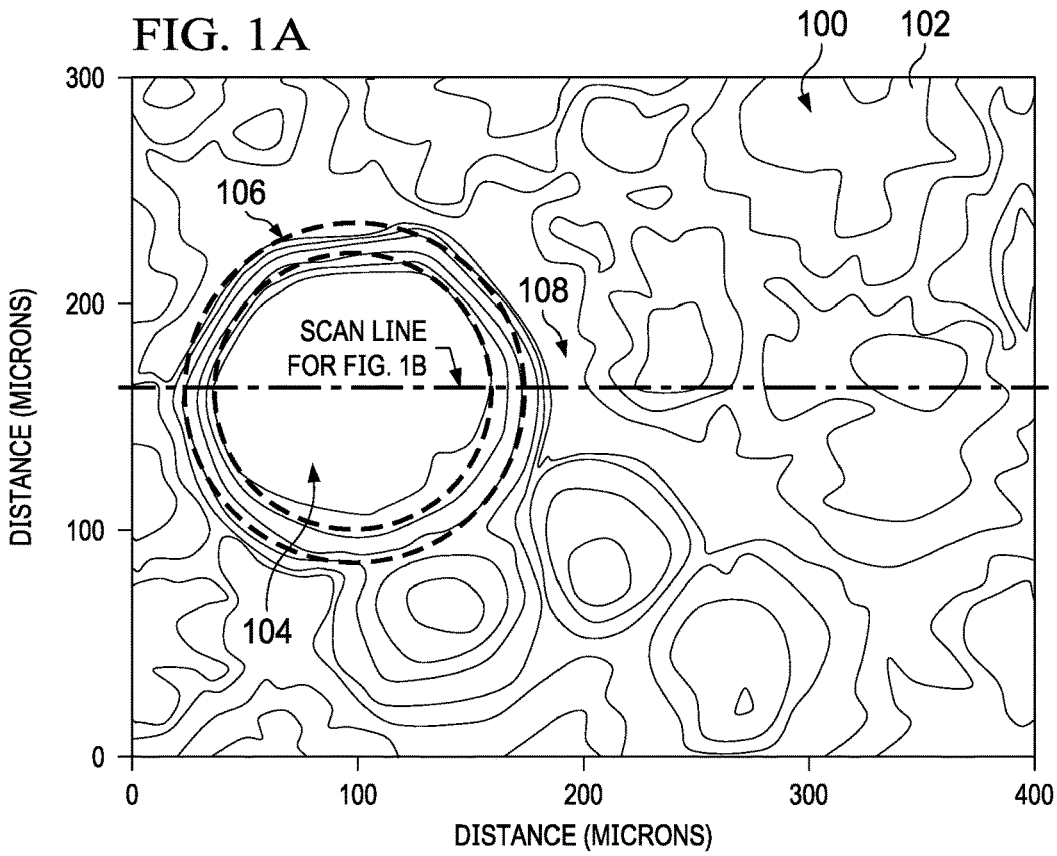
FIG. 1A is a contour diagram and FIG. 1B is a surface profile chart of a top surface of a buffer layer that is approximately 7 microns thick.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device includes a gallium nitride field effect transistor (GaN FET), which in this disclosure is a high electron mobility transistor (HEMT). The semiconductor device is formed on a silicon substrate with a buffer layer of III-N semiconductor material formed over the silicon substrate by a vapor phase epitaxial process. The buffer layer includes a nucleation sublayer with a high aluminum content immediately over the silicon substrate, stress relief sublayers with increasing gallium content, and an unintentionally doped (UID) sublayer that extends to a top surface of the buffer layer.

The nucleation sublayer may have a stoichiometry to match a crystal lattice of the silicon substrate. For example, the silicon substrate may be implemented as a silicon wafer, 150 millimeters to 300 millimeters in diameter, with a (111) lattice orientation, and the nucleation sublayer may be implemented with aluminum providing at least 90 atomic percent of the group III content in the nucleation sublayer, and may be implemented as aluminum nitride. Nucleation of the buffer layer may not be uniform over the silicon substrate; the III-N semiconductor material may start growing in separate locations across the silicon substrate, merging into a continuous layer.

The stress relief sublayers extend from the nucleation sublayer to the UID sublayer. The stress relief sublayer that contacts the nucleation sublayer may have a stoichiometry that is close to a stoichiometry of the nucleation sublayer, to reduce stress in the buffer layer. For example, the stress relief sublayer that contacts the nucleation sublayer may have a high aluminum content and a low gallium content. The stress relief sublayers may have decreasing aluminum content and increasing gallium content from the nucleation sublayer to the UID sublayer. The stress relief sublayer that contacts the UID sublayer may have a stoichiometry that is close to a stoichiometry of the UID layer, to reduce stress in the buffer layer.

The UID sublayer may have a gallium content of at least 90 atomic percent of the group III content in the UID sublayer. The UID sublayer may be implemented as gallium nitride.

The III-N semiconductor material of the buffer layer has a hexagonal crystal structure, formally known as wurtzite. The buffer layer has a (0001) crystal orientation, with c-planes of the III-N semiconductor material parallel to a boundary plane between the buffer layer and the silicon substrate. A-planes and m-planes of the monocrystalline layer are perpendicular to the boundary plane. The buffer layer grows with hexagonal columnar crystals, up to 200 microns wide, growing vertically from the silicon substrate, that extend above the III-N semiconductor material growing adjacent to the hexagonal columnar crystals.

A thickness of the buffer layer is determined by a need to isolate the silicon substrate from the subsequently-formed GaN FET. For example, a GaN FET designed to operate at 650 volts may require a buffer layer with a thickness of 7 microns.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide another portion of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N semiconductor materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

It is noted that terms such as top, bottom, over, above, under, and below may be used in this disclosure. These terms should not be construed as limiting the position or orientation of a structure or element, but should be used to provide spatial relationship between structures or elements. The terms "lateral" and "laterally" refer to directions parallel to a boundary plane between the silicon substrate and the buffer layer. The terms "vertical" and "vertically" refer to directions perpendicular to the boundary plane between the silicon substrate and the buffer layer.

Figure 1B:
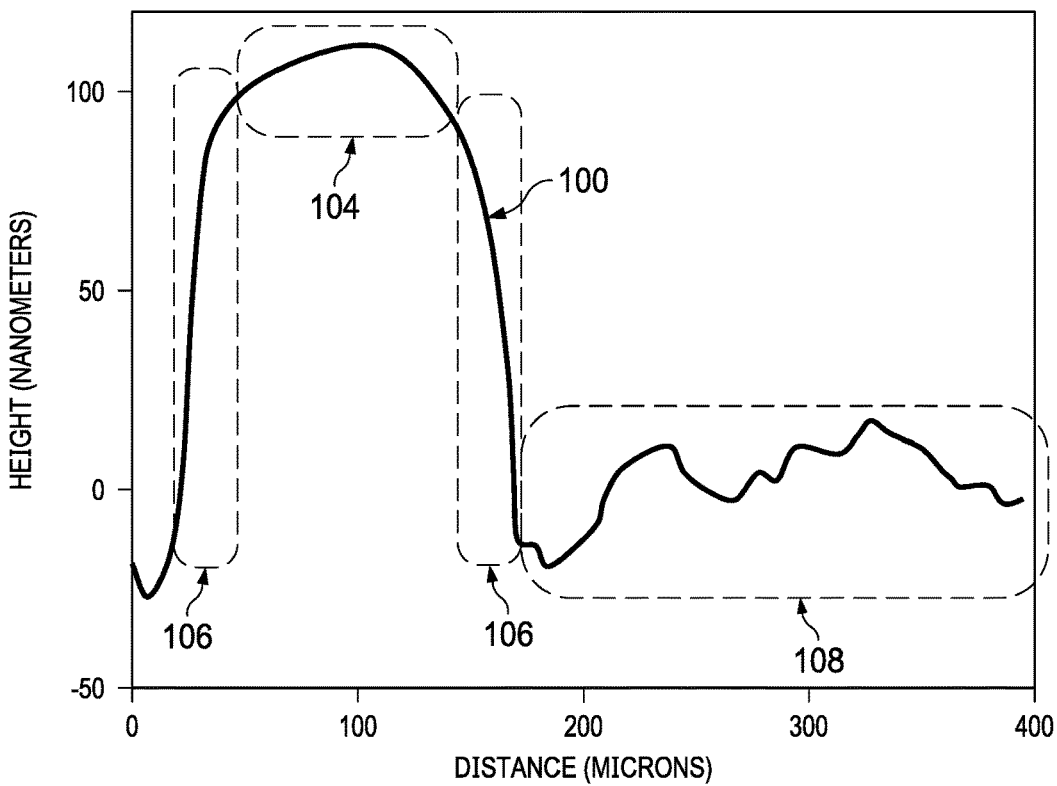

FIG. 1A is a contour diagram and FIG. 1B is a surface profile chart of a top surface 100 of a buffer layer 102 that is approximately 7 microns thick. The buffer layer 102 was formed on a silicon substrate. FIG. 1A depicts a region of the top surface 100 approximately 400 microns by 300 microns. The buffer layer 102 may be characterized by a columnar region 104 surrounded by a transition region 106. The buffer layer 102 further includes an inter-columnar region 108 around the transition region 106. A surface profile, charted in FIG. 1B, was taken along the scan line depicted in FIG. 1A.

FIG. 1B shows a height of the top surface 100, on the vertical axis, as a function of distance, on the horizontal axis, along the scan line shown in FIG. 1A. The scan line extends over the columnar region 104 and the transition region 106, and further into the adjacent inter-columnar region 108. The vertical axis of the chart in FIG. 1B has an arbitrary zero point.

The columnar region 104 in this chart is approximately 100 microns wide. In general, the columnar region 104 may be 50 microns to 200 microns wide. The top surface 100 in the columnar region 104 has vertical range approximately 20 nanometers, in this chart. In general, the vertical range of the top surface 100 in the columnar region 104 may be 10 nanometers to 40 nanometers. The top surface 100 in the columnar region 104 is substantially free of depressions, protrusions, and undulations, so that the top surface 100 in the columnar region 104 may have a peak slope less than 0.1 percent. The peak slope is a maximum value of a vertical rise of the top surface 100 divided by a lateral distance along the top surface 100 in which the vertical rise is obtained. The lateral distance may be 1 micron to 2 microns, for example.

The columnar region 104 extends above the inter-columnar region 108 by approximately 80 nanometers to 120 nanometers, in this chart. In general, the columnar region 104 may extend above the inter-columnar region 108 by 50 nanometers to 200 nanometers.

The transition region 106 in this chart is approximately 30 microns wide. In general, the transition region 106 may be 5 microns to 40 microns wide. The top surface 100 in the transition region 106 extends from the columnar region 104 to the inter-columnar region 108, and so has a vertical range of 80 nanometers to 120 nanometers, in this chart. In general, the vertical range of the top surface 100 in the transition region 106 may be 50 nanometers to 200 nanometers. The top surface 100 in the transition region 106 may have a peak slope of 0.5 percent to 2.0 percent. Thus, the top surface 100 in the transition region 106 has a higher portion of surfaces off of the c-plane than the top surface 100 in the columnar region 104. The top surface 100 in the inter-columnar region 108 may have a portion surfaces off of the c-plane that is between the columnar region 104 and the transition region 106. The surfaces off of the c-plane may be a few atomic layers wide, in some cases.

Figure 2A:
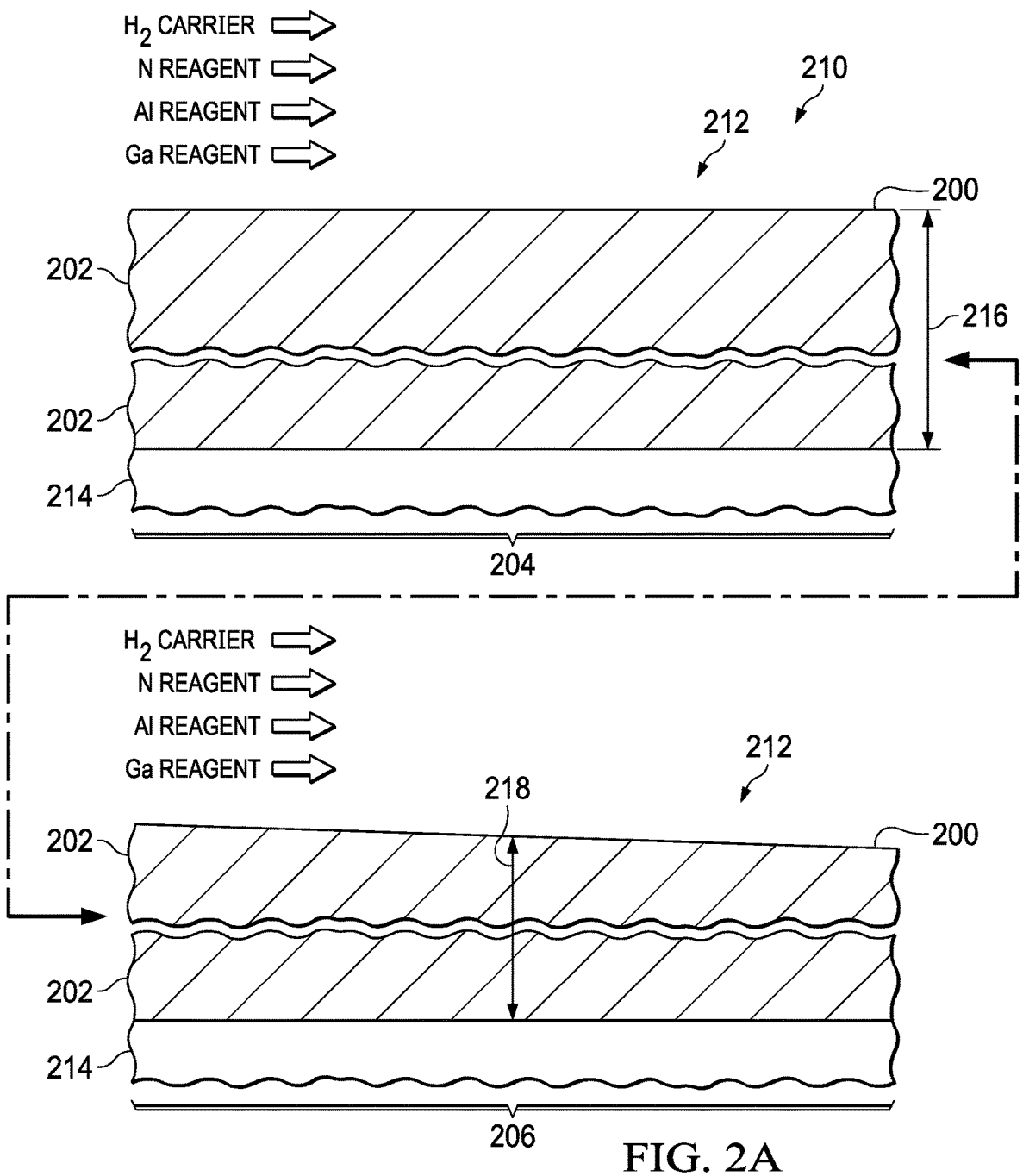
FIG. 2A through FIG. 2H are cross sections of an example semiconductor device that includes a gallium nitride field effect transistor (GaN FET), depicted in stages of an example method of formation.

FIG. 2A through FIG. 2H are cross sections of a semiconductor device 210 that includes a GaN FET 212, depicted in stages of an example method of formation. In this example, the GaN FET 212 is described as an enhancement mode GaN FET. Referring to FIG. 2A, the semiconductor device 210 is formed on a silicon substrate 214. The silicon substrate 214 may be implemented as a silicon wafer having a (111) crystal orientation. The silicon wafer may have a diameter of 150 millimeters to 300 millimeters, for example. Other implementations of the silicon substrate 214, are within the scope of this example.

A buffer layer 202 of III-N semiconductor material is formed over the silicon substrate 214 by a vapor epitaxial process. Formation of the buffer layer 202 may start with forming a nucleation sublayer of aluminum nitride, using an aluminum-containing gas reagent, labeled "Al REAGENT", a nitrogen-containing gas reagent, labeled "N REAGENT", and a carrier gas that includes hydrogen gas, labeled "$H_2$ CARRIER" in FIG. 2A, at a temperature of 700° C. to 900° C., to reduce formation of silicon nitride and reduce dislocations. Additional sublayers of III-N semiconductor material are grown, with decreasing aluminum content and increasing gallium content, using a gallium-containing gas reagent, labeled "Ga REAGENT" in FIG. 2A. The temperature of the silicon substrate 214 is increased to 1000° C. to 1200° C. while growing the additional sublayers of III-N semiconductor material, to reduce defects in the buffer layer 202. The buffer layer 202 has a UID layer of gallium nitride extending to a top surface 200 of the buffer layer 202. The top surface 200 is located opposite from a boundary plane between the silicon substrate 214 and the buffer layer 202. The aluminum-containing gas reagent may be implemented as trimethylaluminum or triethylaluminum, for example. The nitrogen-containing gas reagent may be implemented as ammonia, hydrazine, or 1,1 dimethylhydrazine, for example. The gallium-containing gas reagent may be implemented as trimethylgallium or triethylgallium, for example. The buffer layer 202 may have an average thickness of 5 microns to 10 microns, by way of example, to accommodate operating potentials in the GaN FET 212 greater than 500 volts.

The buffer layer 202 includes a columnar region 204 and a transition region 206. The columnar region 204 has a first average buffer thickness 216, and the transition region 206 has a second average buffer thickness 218. The first average buffer thickness 216 is greater than the second average buffer thickness 218. By way of example, the first average buffer thickness 216 may exceed the second average buffer thickness 218 by 25 nanometers to 100 nanometers. The buffer layer 202 in the columnar region 204 has a more constant thickness than the buffer layer 202 in the transition region 206. The top surface 200 of the buffer layer 202 in the columnar region 204 may have a peak slope less than 0.1 percent, over a lateral distance of at least a micron, while the top surface 200 of the buffer layer 202 in the transition region 206 may have a peak slope of 0.5 percent to 2.0 percent, over a lateral distance of at least a micron. The top surface 200 of the buffer layer 202 in the columnar region 204 is depicted as essentially flat in FIG. 2A, while the top surface 200 of the buffer layer 202 in the transition region 206 is depicted as sloped in FIG. 2A, to emphasize the difference between the slopes of the top surface 200.

Figure 2B:
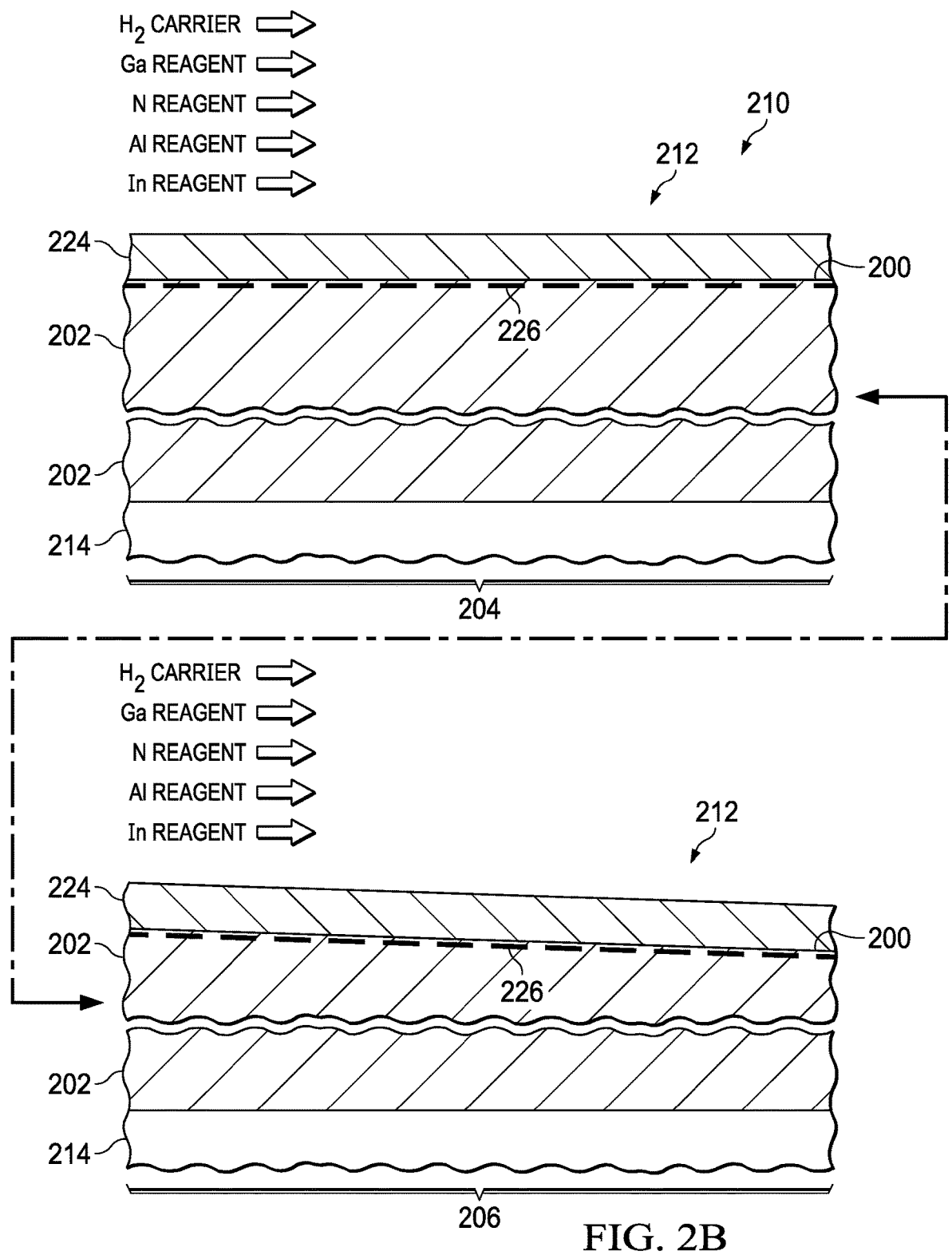
Figure 2C:
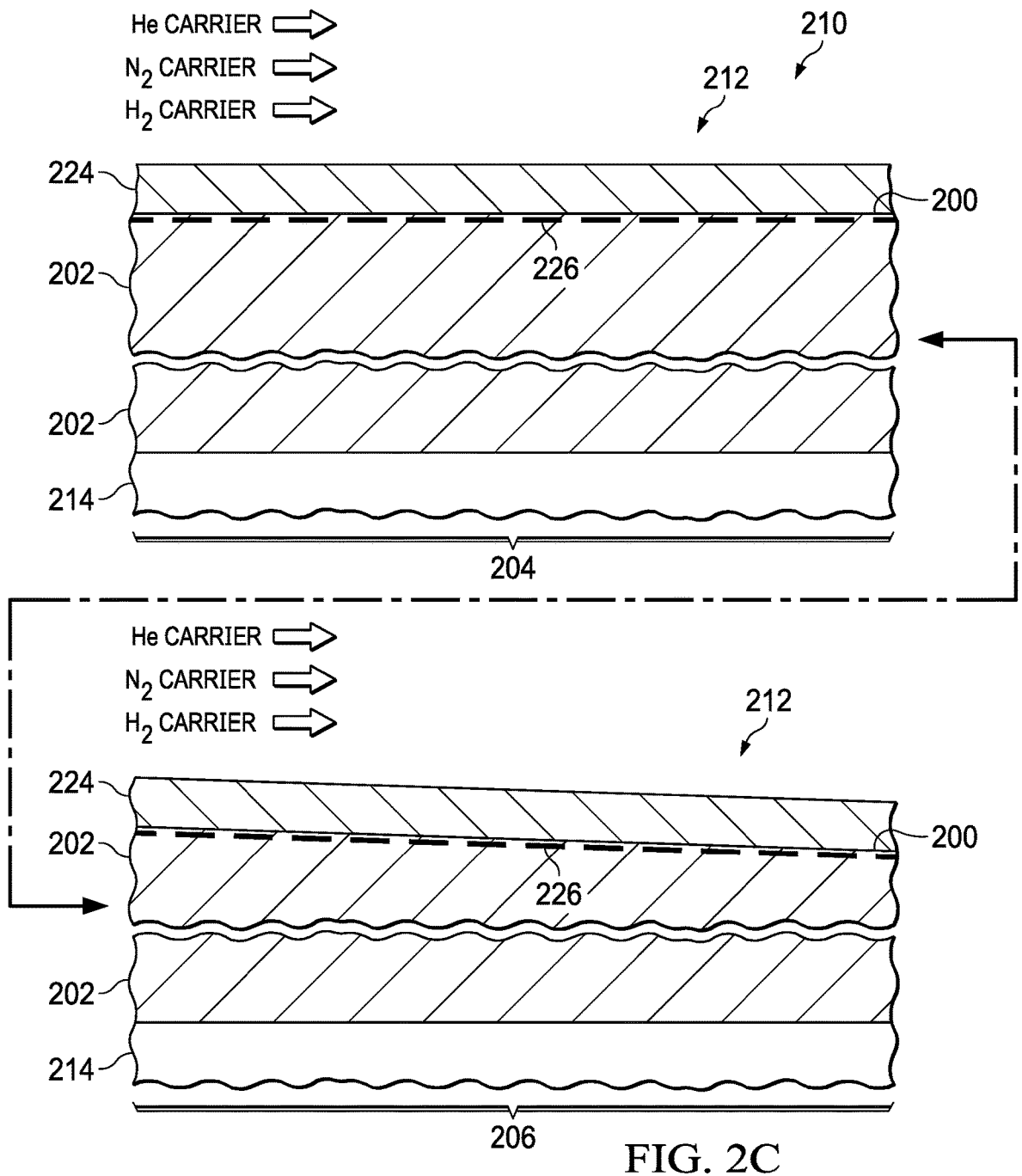
Figure 2D:
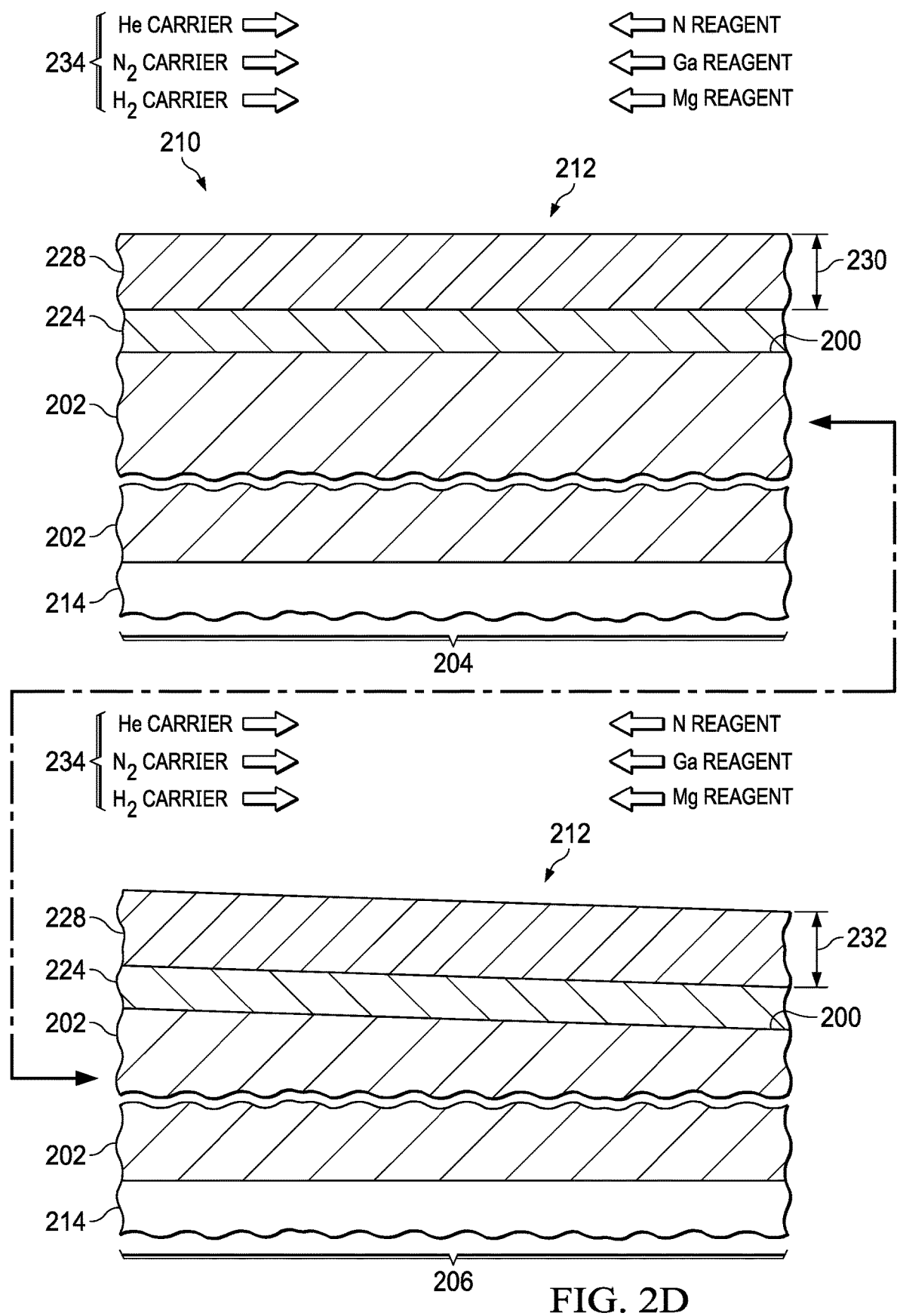
Figure 2E:
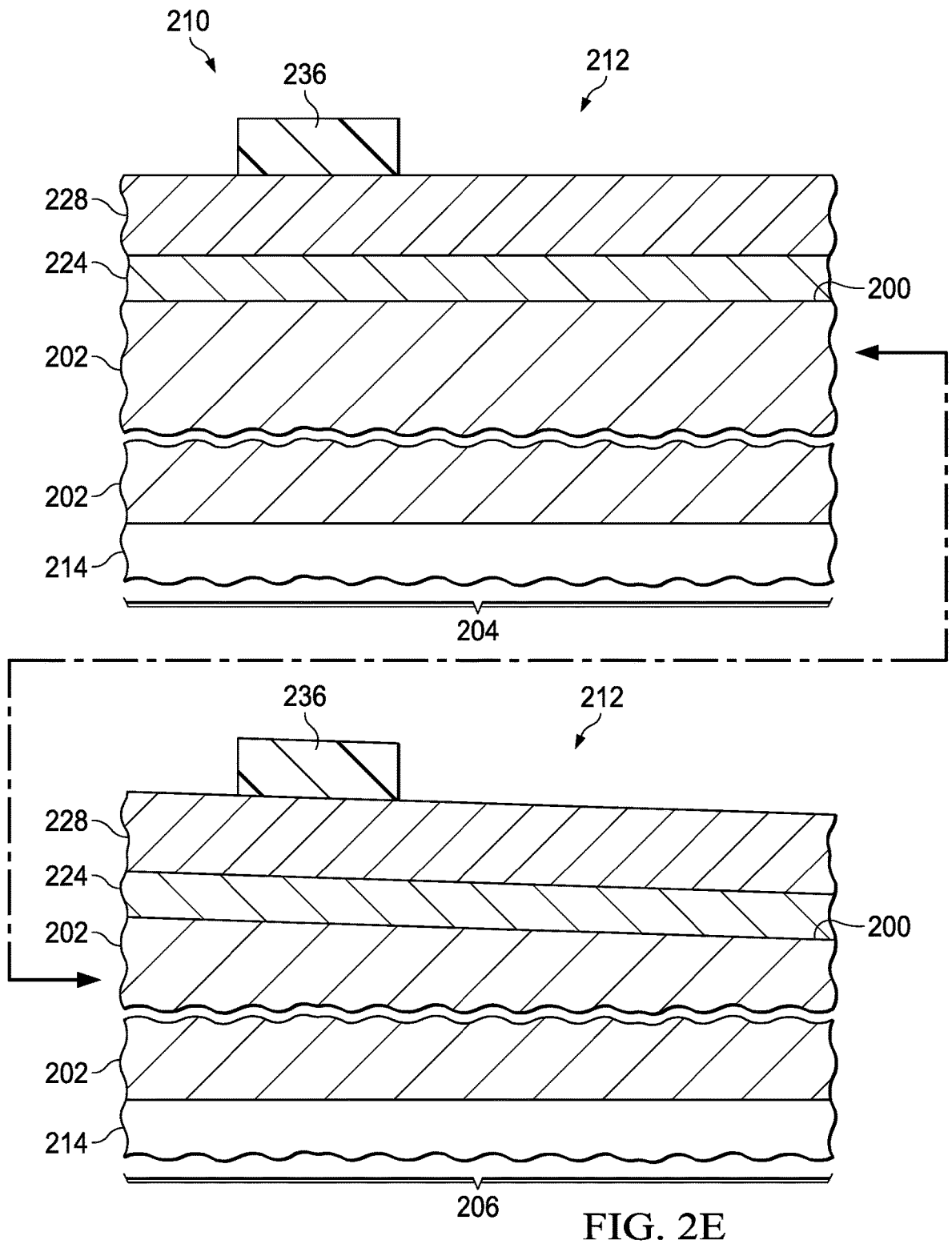
Figure 2F:
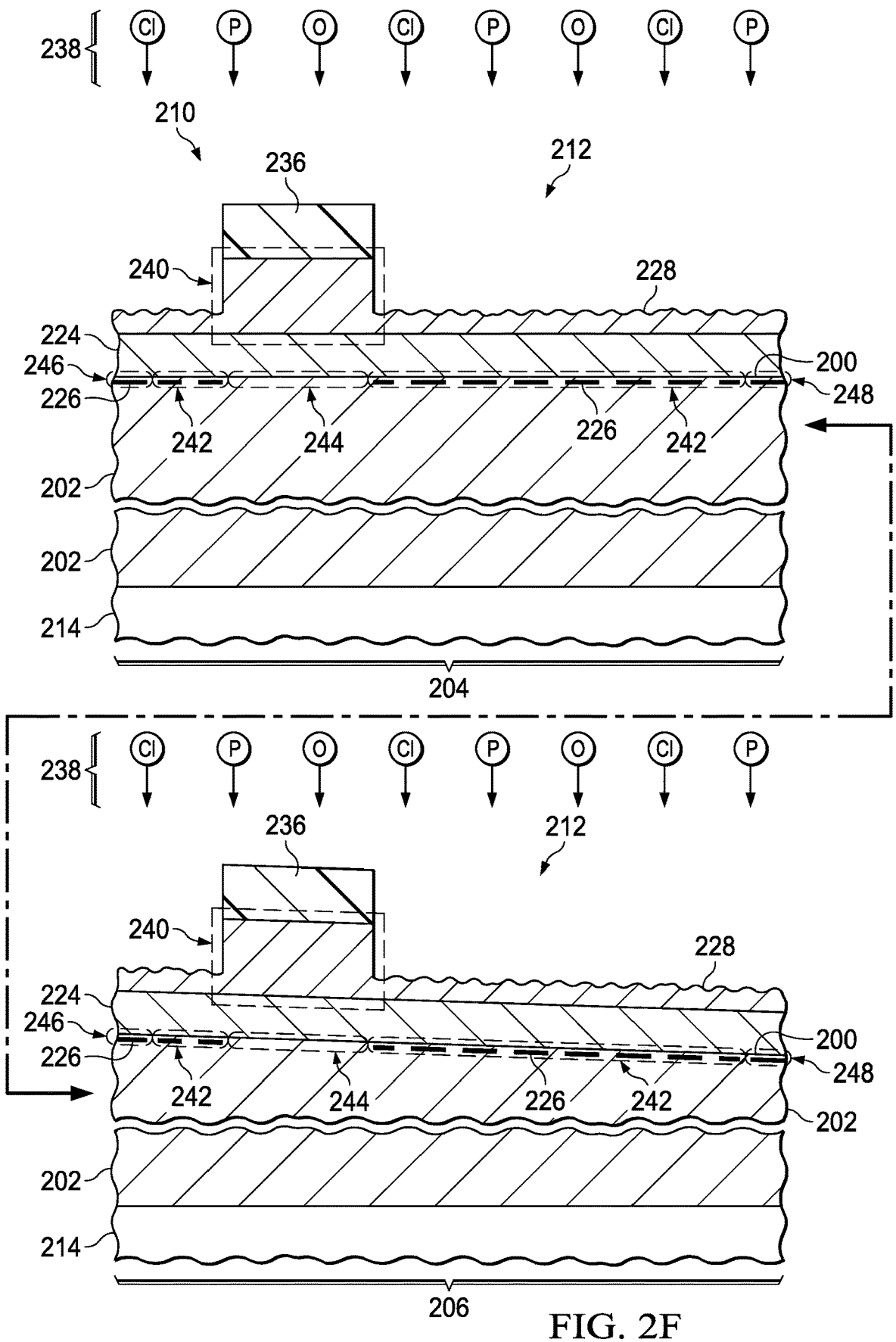
Figure 2G:
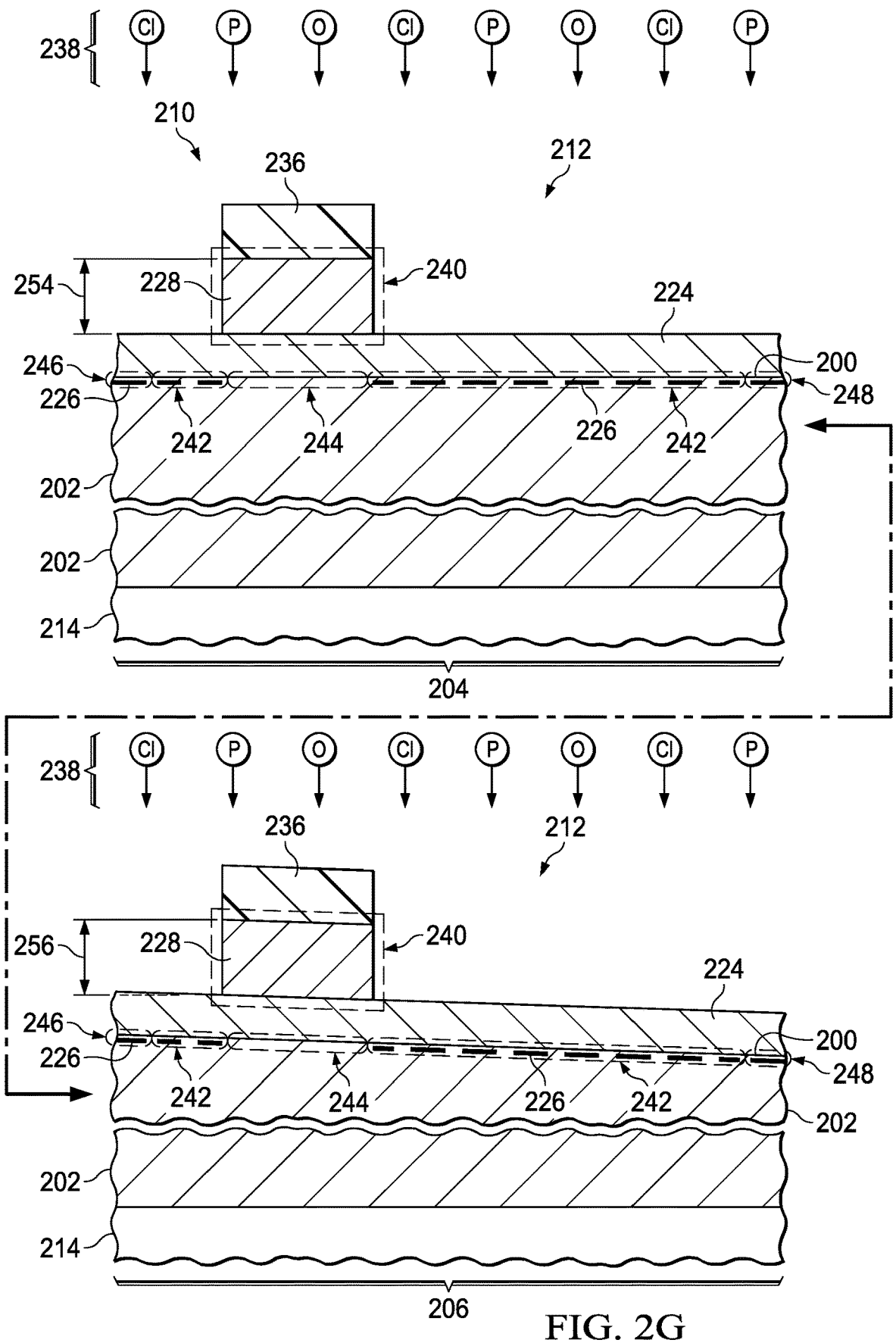
Figure 2H:
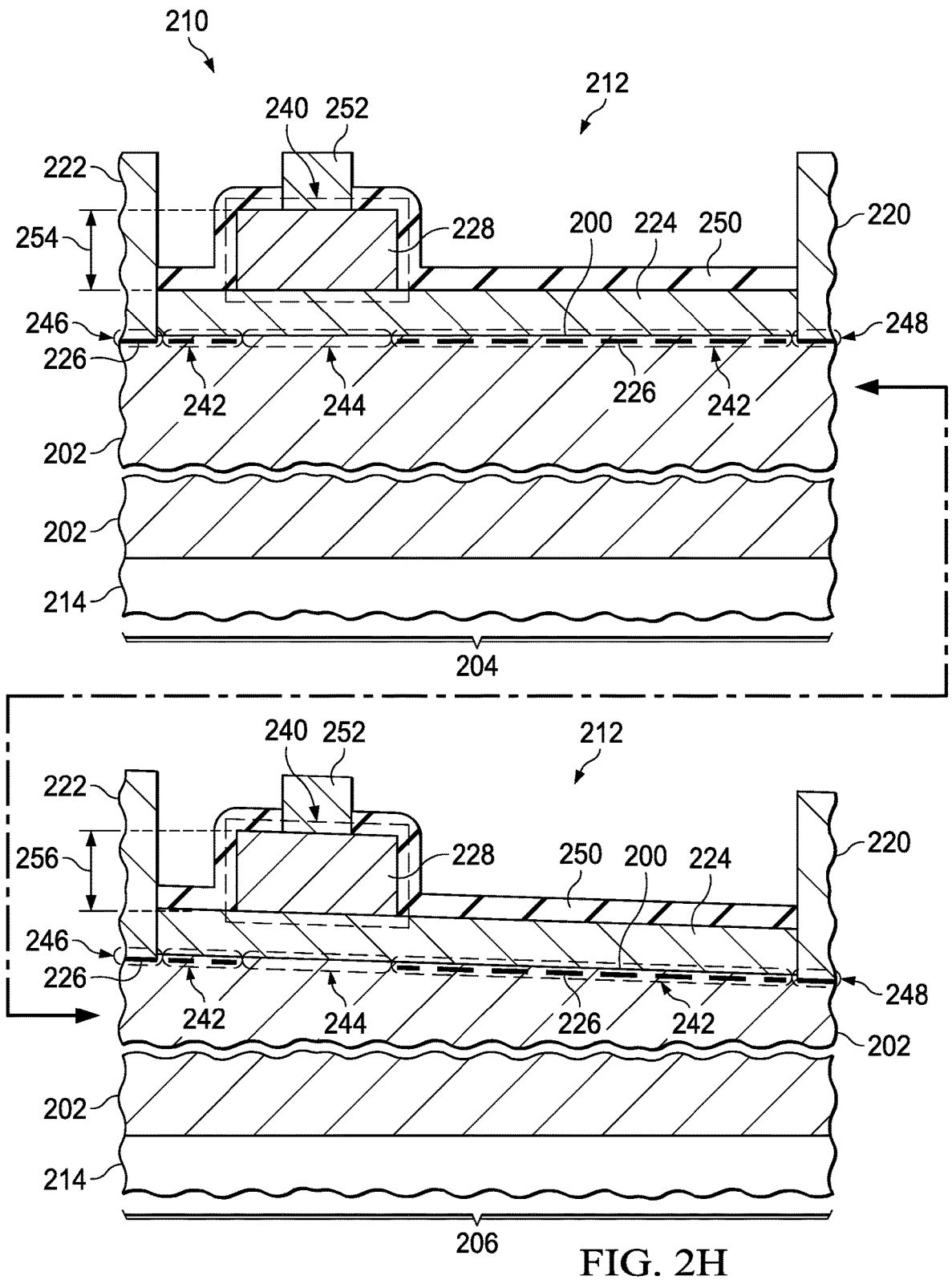

The GaN FET 212 of this example includes multiple fingers, with each finger extending from a drain contact 220 to a source contact 222; the drain contact 220 and the source contact 222 are shown in FIG. 2H. FIG. 2A through FIG. 2H depict a first finger of the GaN FET 212 extending along the columnar region 204, and a second finger of the GaN FET 212 extending along the transition region 206. The GaN FET 212 may further extend over an inter-columnar region, not shown, of the buffer layer 202.

Referring back to FIG. 2A, the first finger of the GaN FET 212, in columnar region 204, and the second finger of the GaN FET 212, in the transition region 206, may each extend a lateral distance of 5 microns to 10 microns, by way of example. The top surface 200 in the columnar region 204 may have a vertical range in the first finger of the GaN FET 212 that is less than 10 nanometers. The top surface 200 in the transition region 206 in the second finger of the GaN FET 212 may have a vertical range greater than 25 nanometers. Because the vertical range is greater in the transition region 206, the top surface 200 in the transition region 206 has a higher portion of surfaces off of the c-plane than the top surface 200 in the columnar region 204. Forming the buffer layer 202 over the silicon substrate 214 by the vapor phase epitaxial process may advantageously provide a lower cost for the semiconductor device 210 compared to other methods, such as epitaxy on silicon carbide.

Referring to FIG. 2B, a barrier layer 224 of III-N semiconductor material is formed over the buffer layer 202. The GaN FET 212 includes the barrier layer 224. The barrier layer 224 includes aluminum and nitrogen, and may include gallium, indium, or other group III element. The barrier layer 224 has an aluminum content of at least 25 atomic percent. The barrier layer 224 stresses the buffer layer 202 at the top surface 200, generating a quantum well in the buffer layer 202, just under the top surface 200, which accumulates free electrons to provide a two-dimensional electron gas (2DEG) 226 of the GaN FET 212. In one version of this example, the barrier layer 224 may include primarily aluminum nitride, with an aluminum content of 49 atomic percent to 50 atomic percent. In another version, the barrier layer 224 may have a stoichiometry of $Al_{0.83}In_{0.17}N$, within a few atomic percent, that is, with an aluminum content of 41 atomic percent to 42 atomic percent, which provides a close lattice match to gallium nitride in the buffer layer 202. In a further version, the barrier layer 224 may include gallium and indium, with an aluminum content of 25 atomic percent to 50 atomic percent; the gallium may improve uniformity of the indium in the barrier layer 224. The barrier layer 224 may have a thickness of 10 nanometers to 25 nanometers, which, combined with the stoichiometry of the barrier layer 224, may provide a desired free charge carrier density in the 2DEG 226. The 2DEG 226 may have a free charge carrier density of $3 \times 10^{12}$ cm$^{-2}$ to $2 \times 10^{13}$ cm$^{-2}$, by way of example.

The barrier layer 224 may be formed by a barrier metal organic vapor phase epitaxy (MOVPE) process using an aluminum-containing gas reagent and a nitrogen-containing gas reagent, labeled "Al REAGENT" and "N REAGENT" respectively, in FIG. 2B. The aluminum-containing gas reagent may be implemented as trimethylaluminum or triethylaluminum. The nitrogen-containing gas reagent may be implemented as ammonia, hydrazine, or 1,1 dimethylhydrazine. In versions of this example in which the barrier layer 224 includes gallium, the barrier MOVPE process uses a gallium-containing gas reagent, labeled "Ga REAGENT" in FIG. 2B. The gallium-containing gas reagent may be implemented as trimethylgallium or triethylgallium. In versions of this example in which the barrier layer 224 includes indium, the barrier MOVPE process uses an indium-containing gas reagent, labeled "In REAGENT" in FIG. 2B. The indium-containing gas reagent may be implemented as trimethylindium or triethylindium, for example. The barrier MOVPE process uses a carrier gas containing hydrogen, labeled "$H_2$ CARRIER" in FIG. 2B. The buffer layer 202 may be heated to 900° C. to 1100° C. during the barrier MOVPE process.

The barrier layer 224 in the transition region 206 may have a similar slope as the top surface 200 in the transition region 206, that is, a slope of 0.5 percent to 2.0 percent. Similarly, the barrier layer 224 in the columnar region 204 may have a similar slope as the top surface 200 in the columnar region 204, that is, a slope less than 0.1 percent. Thus, the barrier layer 224 in the transition region 206 has a higher portion of surfaces off of the c-plane than the columnar region 204.

Referring to FIG. 2C, growth of III-N semiconductor material is temporarily interrupted by a growth interruption. During the growth interruption, flow rates of the aluminum-containing gas reagent, the nitrogen-containing gas reagent and the gallium-containing gas reagent used in the barrier MOVPE process are adjusted to zero. During the growth interruption, the temperature of the silicon substrate 214 may be adjusted to a temperature suitable for subsequently forming a gate layer 228, shown in FIG. 2D. During the growth interruption, a mixture of carrier gases may be changed subsequently forming the gate layer 228. Nitrogen gas, labeled "$N_2$ CARRIER" in FIG. 2C, is added to the carrier gases. A flow rate of hydrogen gas, labeled "$H_2$ CARRIER" in FIG. 2C, may be decreased or turned off. Optionally, helium gas, labeled "He CARRIER" in FIG. 2C, may be added to the carrier gases to reduce turbulence in the carrier gases. Argon gas may optionally be added to the carrier gases or substituted for the helium gas. The growth interruption may be limited to a time interval sufficient to adjust the temperature and carrier gases, or may be extended to ensure the temperature is equilibrated and the carrier gas flows are stable. The growth interruption may advantageously reduce defects in the subsequently-formed gate layer 228 of FIG. 2D.

Referring to FIG. 2D, the gate layer 228 is formed of III-N semiconductor material by a gate MOVPE process over the barrier layer 224. The gate layer 228 includes primarily gallium and nitrogen, with a p-type dopant, in this example. The gate layer 228 may optionally include aluminum, up to 2 atomic percent, and less aluminum content than the barrier layer 224. The gate layer 228 may optionally include indium. The gate layer 228 has a first gate layer thickness 230 in the columnar region 204 and a second gate layer thickness 232 in the transition region 206. The first gate layer thickness 230 and the second gate layer thickness 232 are both greater than twice the vertical range of the top surface 200 of the buffer layer 202 in the columnar region 204. The first gate layer thickness 230 and the second gate layer thickness 232 may be 40 nanometers to 100 nanometers, by way of example. A difference between the first gate layer thickness 230 and the second gate layer thickness 232 is less than half of the vertical range of the top surface 200 of the buffer layer 202 in the columnar region 204. The gate layer 228 reduces the free charge carrier density in the 2DEG 226 of FIG. 2C to zero, as a result of the work function of the gate layer 228 reducing the quantum well in the buffer layer 202, just under the top surface 200.

The gate MOVPE process uses a carrier gas 234 to transport gas reagents across the semiconductor device 210. The carrier gas 234 may include nitrogen gas, labeled "$N_2$ CARRIER" in FIG. 2D, as a portion, or all, of the carrier gas 234. The gate MOVPE process may include a noble gas, such as helium gas, labeled "He CARRIER" in FIG. 2D, as a portion, or all, of the carrier gas 234. A portion, or all, of the noble gas may be implemented as argon gas in a version of this example. Including the noble gas in the carrier gas 234 may advantageously reduce turbulence in the carrier gas 234. The gate MOVPE process may also use hydrogen gas, labeled "$H_2$ CARRIER" in FIG. 2D, as a portion of the carrier gas 234. The total volumetric flow of the carrier gas 234 may be 50 standard liters per minute (slm) to 150 slm. The hydrogen gas content is 0 percent to 40 percent, by volumetric flow rate, of the carrier gas 234.

The gate MOVPE process uses a gallium-containing gas reagent, labeled "Ga REAGENT" in FIG. 2D, to provide the gallium in the gate layer 228. The gallium-containing gas reagent may be implemented as trimethylgallium or triethylgallium, for example. The gallium-containing gas reagent may have a flow rate of 10 standard cubic centimeters per minute (sccm) to 200 sccm, to control a rate of formation of the gate layer 228.

The gate MOVPE process uses a nitrogen-containing gas reagent, labeled "N REAGENT" in FIG. 2D, to provide the nitrogen in the gate layer 228. The nitrogen-containing gas reagent may be implemented as ammonia, hydrazine, or 1,1 dimethylhydrazine, for example. The nitrogen-containing gas reagent may have a flow rate of 20 slm to 200 slm, to provide an overabundance of nitrogen for forming the III-N semiconductor material of the gate layer 228.

The gate MOVPE process incorporates p-type dopants into the gate layer 228. In this example, the p-type dopants may be implemented as magnesium. The gate MOVPE uses a magnesium-containing gas reagent, labeled "Mg REAGENT" in FIG. 2D, to provide the magnesium in the gate layer 228. The magnesium-containing gas reagent may be implemented as bis(cyclopentadienyl)magnesium, by way of example. Other sources of magnesium-containing gas reagents are within the scope of this example. The magnesium-containing gas reagent may have a flow rate of 50 sccm to 1000 sccm, to provide a desired level of the magnesium in the gate layer 228.

In versions of this example in which the gate layer 228 includes aluminum or indium, the gate MOVPE process may use an aluminum-containing gas reagent or an indium-containing gas reagent, not shown in FIG. 2D. The aluminum-containing gas reagent, if used, may be implemented as trimethylaluminum or triethylaluminum, for example. The indium-containing gas reagent, if used, may be implemented as trimethylindium or triethylindium, for example. Flow rates of the aluminum-containing gas reagent and the indium-containing gas reagent may be selected to provide desired contents of aluminum or indium in the gate layer 228.

The gate MOVPE process may be performed at a total pressure of 150 millibar to 450 millibar, by way of example. The gate MOVPE process may be performed at a temperature of 900° C. to 1100° C. The gate layer 228 may be formed at an epitaxial growth rate of 2 nanometers/minute to 20 nanometers/minute, by way of example. In one version of this example, the gate MOVPE process may be performed in a single-wafer chamber, which may advantageously improve uniformity in the epitaxial growth rate across the silicon substrate 214. In another version, the gate MOVPE process may be performed in a multi-wafer planetary chamber, which may advantageously improve throughput of the gate MOVPE process.

The surfaces off of the c-plane may have a higher density of nitrogen atoms at the top surface 200 than the c-plane facets. The nitrogen gas and the noble gas in the carrier gas 234 may not bind as tightly to nitrogen in the gate layer 228 as hydrogen does, in the surfaces off of the c-plane, reducing surface energies on the surfaces off of the c-plane to values closer to surface energies on the c-plane facets. Use of the nitrogen gas or the noble gas in the carrier gas 234 results in epitaxial growth rates on the surfaces off of the c-plane that are more equal to the epitaxial growth rate on the c-plane facets, which advantageously provides improved uniformity in the gate layer 228 across the silicon substrate 214, particularly in the columnar region 204 and in the transition region 206. Without the nitrogen gas or the noble gas displacing the hydrogen gas from the surface, the gate layer 228 would undesirably grow at a faster rate on the surfaces off of the c-plane, resulting in the gate layer 228 being unacceptably thicker in the transition region 206 compared to the columnar region 204, due to the higher density of exposed surfaces off of the c-plane in the transition region 206.

Referring to FIG. 2E, a gate mask 236 is formed over the gate layer 228. The gate mask covers an area of the gate layer 228 for a subsequently-formed gate 240 of the GaN FET 212, shown in FIG. 2F. In one version of this example, the gate mask 236 may include photoresist, formed directly by a photolithographic process. The gate mask 236 may include organic anti-reflection material such as a bottom anti-reflection coat (BARC) layer under the photoresist. The BARC layer may be patterned after the photolithographic process is completed. In another version of this example, the gate mask 236 may include inorganic hard mask material, such as silicon dioxide or silicon nitride. In a further version, the gate mask 236 may include metal hard mask material, such as nickel. The hard mask material, inorganic or metal, may be patterned by forming a photoresist pattern over the hard mask material, followed by etching the hard mask material using a reactive ion etch (RIE) process using fluorine radicals or an ion milling process. Hard mask material in the gate mask 236 may provide improved control of the lateral dimension of the gate 240.

Referring to FIG. 2F, a gate etch process 238 removes the gate layer 228 where exposed by the gate mask 236, leaving the gate layer 228 under the gate mask 236 to form the gate 240. The gate etch process 238 may be performed in an inductively coupled plasma (ICP) etcher, which generates a plasma containing chemically reactive neutral species, ions, and electrons. The gate etch process 238 includes a chemical etchant species, a physical etchant species, and an aluminum passivating species. The chemical etchant species may be implemented as chlorine radicals, labeled "Cl" in FIG. 2F, or bromine radicals, for example. The chlorine radicals may be provided by chlorine gas, silicon tetrachloride, boron trichloride, or a combination thereof. The bromine radicals may be provided by boron tribromide, for example.

The physical etchant species may be implemented by one or more ion species. Examples of the physical etchant species include fluorine ions, noble gas ions such as argon ions or helium ions, and oxygen ions. Other ion species in the physical etchant species are within the scope if this example. The fluorine ions may be provided by silicon hexafluoride, carbon tetrafluoride, or nitrogen trifluoride, for example. The noble gas ions may be provided by argon gas or helium gas. The oxygen ions may be provided by oxygen gas or carbon monoxide gas, for example. The physical etchant species are labeled "P" in FIG. 2F, to denote the physical etchant species may include a plurality of ion species.

The aluminum passivating species may be implemented as oxygen radicals, labeled "O" in FIG. 2F, or fluorine radicals. The oxygen radicals may be provided by oxygen gas. The fluorine radicals may be provided by silicon hexafluoride, carbon tetrafluoride, or nitrogen trifluoride, for example.

The chemical etchant species binds to gallium atoms in the gate layer 228. The physical etchant species impacts the gate layer 228 and imparts sufficient energy to facilitate separation of the gallium atoms that are bound to the chemical etchant species from the gate layer 228. The gallium atoms that are separated from the gate layer 228 are removed by the ICP etcher. The ICP etcher has a first power supply for forming a plasma which generates the chemical etchant species, the physical etchant species, and the aluminum passivating species, and a second power supply to independently control a potential difference between the plasma and the substrate 214. The first power supply may be operated at a power of 250 watts to 500 watts, for a 150 millimeter wafer, by way of example. The second power supply may be adjusted to operate initially at 20 watts to 100 watts, to provide an impact energy of the physical etchant species sufficient to facilitate separation of the gallium atoms from the gate layer 228. As the gate etch process 238 nears completion, the power level of the second power supply may be reduced, to 20 watts to 50 watts to reduce the energy provided for chemical reactions, which reduces removal of aluminum more significantly than removal of gallium, thus providing etch selectivity. Reducing the power level of the second power supply may thus decrease an etch rate of the barrier layer 224, relative to the gate layer 228, because the gate layer 228 includes more gallium and less aluminum than the barrier layer 224.

The gate etch process 238 may be performed at a pressure 10 millitorr to 50 millitorr, to improve the etching selectivity. The aluminum passivating species further improves the etching selectivity by combining preferentially with aluminum in the barrier layer 224, minimizing the sites available for the chemical etchant species to react with the gallium and nitrogen. Thus, the gate etch process 238 may remove the gate layer 228 completely where exposed by the gate mask 236, without removing a significant amount of the barrier layer 224. FIG. 2F depicts the gate etch process 238 partway to completion.

As the gate layer 228 is removed, the free charge carrier density in the 2DEG 226 increases in access regions 242 adjacent to the gate 240, because the thickness of the gate layer 228 is decreasing outside of the gate 240. The buffer layer 202 remains free of free charges below the gate 240 in a channel region 244 between the access regions 242, because the thickness of the gate layer 228 remains constant in the gate 240.

The 2DEG 226 extends through a source region 246 in an area for a source of the GaN FET 212. The source region 246 is laterally separated from the channel region 244 by one of the access regions 242. The 2DEG 226 extends through a drain region 248 in an area for a drain of the GaN FET 212. The drain region 248 is laterally separated from the channel region 244 by another of the access regions 242, and is located opposite from the source region 246.

Referring to FIG. 2G, the gate etch process 238 may be continued in an overetch step, after the gate layer 228 is removed outside of the gate 240. Reducing the power level of the second power supply to 20 watts to 50 watts and providing the aluminum passivating species may advantageously enable complete removal of the gate layer 228 across the silicon substrate 214, despite variations in thickness of the gate layer 228 across the silicon substrate 214, without removing a significant amount of the barrier layer 224. Thus, the GaN FET 212 is free of the III-N semiconductor material of the gate layer 228 of FIG. 2F over the barrier layer 224 adjacent to the gate 240.

The free charge carrier density in the access regions 242 may increase to a value comparable to the free charge carrier density before the gate layer 228 was formed. The free charge carrier density in the access regions 242 may be $3 \times 10^{12}$ cm$^{-2}$ to $2 \times 10^{13}$ cm$^{-2}$, to provide the desired on-state resistance for the GaN FET 212.

The gate mask 236 is subsequently removed. Photoresist and other organic material in the gate mask 236 may be removed by an oxygen plasma process, a wet etch process, or a combination of both. Inorganic hard mask material in the gate mask 236 may be removed by an RIE process using fluorine radicals. Metal in the gate mask 236 may be removed by a wet etch process using a combination of nitric acid, acetic acid and sulfuric acid, or a solution of ferric chloride.

The gate etch process 238 and removal of the gate mask 236 may remove an insignificant amount from the gate layer 228 from the gate 240, or may remove none of the gate layer 228 from the gate 240.

The gate 240 has a first gate thickness 254 over the columnar region 204 and a second gate thickness 256 over the transition region 206. Both the first gate thickness 254 and the second gate thickness 256 are greater than twice the vertical range of the top surface 200 of the buffer layer 202 in the columnar region 204. Both the first gate thickness 254 and the second gate thickness 256 may be 40 nanometers to 100 nanometers thick. A difference between the first gate thickness 254 and the second gate thickness 256 is less than the vertical range of the top surface 200 of the buffer layer 202 in the columnar region 204.

Referring to FIG. 2H, a dielectric layer 250 may be formed over the barrier layer 224 adjacent to the gate 240. The dielectric layer 250 may include one or more sublayers of silicon dioxide, silicon nitride, aluminum oxide, or any combination thereof. The dielectric layer 250 may be formed by one or more low pressure chemical vapor deposition (LPCVD) processes, plasma enhanced chemical vapor deposition (PECVD) processes, high density plasma (HDP) processes, or atomic layer deposition (ALD) processes, by way of example. The dielectric layer 250 may advantageously protect the barrier layer 224 from physical or chemical degradation. The dielectric layer 250 may extend partway over the gate 240, as depicted in FIG. 2H.

A gate contact 252 is formed through the dielectric layer 250, contacting the gate 240. The source contact 222 is formed through the dielectric layer 250 and the barrier layer 224, contacting the 2DEG 226 at the source region 246. The drain contact 220 is formed through the dielectric layer 250 and the barrier layer 224, contacting the 2DEG 226 at the drain region 248. The gate contact 252, the source contact 222, and the drain contact 220 are electrically conductive, and may include one or more metals, such as titanium, tungsten, or aluminum, or may include other electrically conductive material such as carbon nanotubes or graphene. In this example, the gate contact 252, the source contact 222, and the drain contact 220 may be aligned with edges of the dielectric layer 250, as depicted in FIG. 2H.

During operation of the GaN FET 212, the drain contact 220 may be biased at a positive potential with respect to the source contact 222. The gate contact 252 may be biased at the same potential as the source contact 222, causing no free charge carriers in the channel region 244, so that current flow from the drain contact 220 to the source contact 222 is limited to leakage current, that is, less than a milliamp per centimeter of channel width of the GaN FET 212. The GaN FET 212 is in an off state, or "turned off". The potential applied to the gate contact 252 with respect to the source contact 222 may subsequently be raised sufficiently to cause free charge to accumulate in the channel region 244, that is, the potential applied to the gate contact 252 may be raised above a threshold potential of the GaN FET 212, resulting in current flowing from the drain contact 220 through the 2DEG 226 to the source contact 222. Having the difference between the first gate thickness 254 and the second gate thickness 256 less than half of the vertical range of the top surface 200 of the buffer layer 202 in the columnar region 204 may advantageously result in more equal currents in the columnar region 204 and the transition region 206, compared to a comparable GaN FET with less uniform gate thickness. In another aspect, having the difference between the first gate thickness 254 and the second gate thickness 256 less than half of the vertical range of the top surface 200 of the buffer layer 202 in the columnar region 204 may advantageously provide more uniform attainment of threshold in the fingers of the GaN FET 212, including the columnar region 204 and the transition region 206.

Figure 3A:
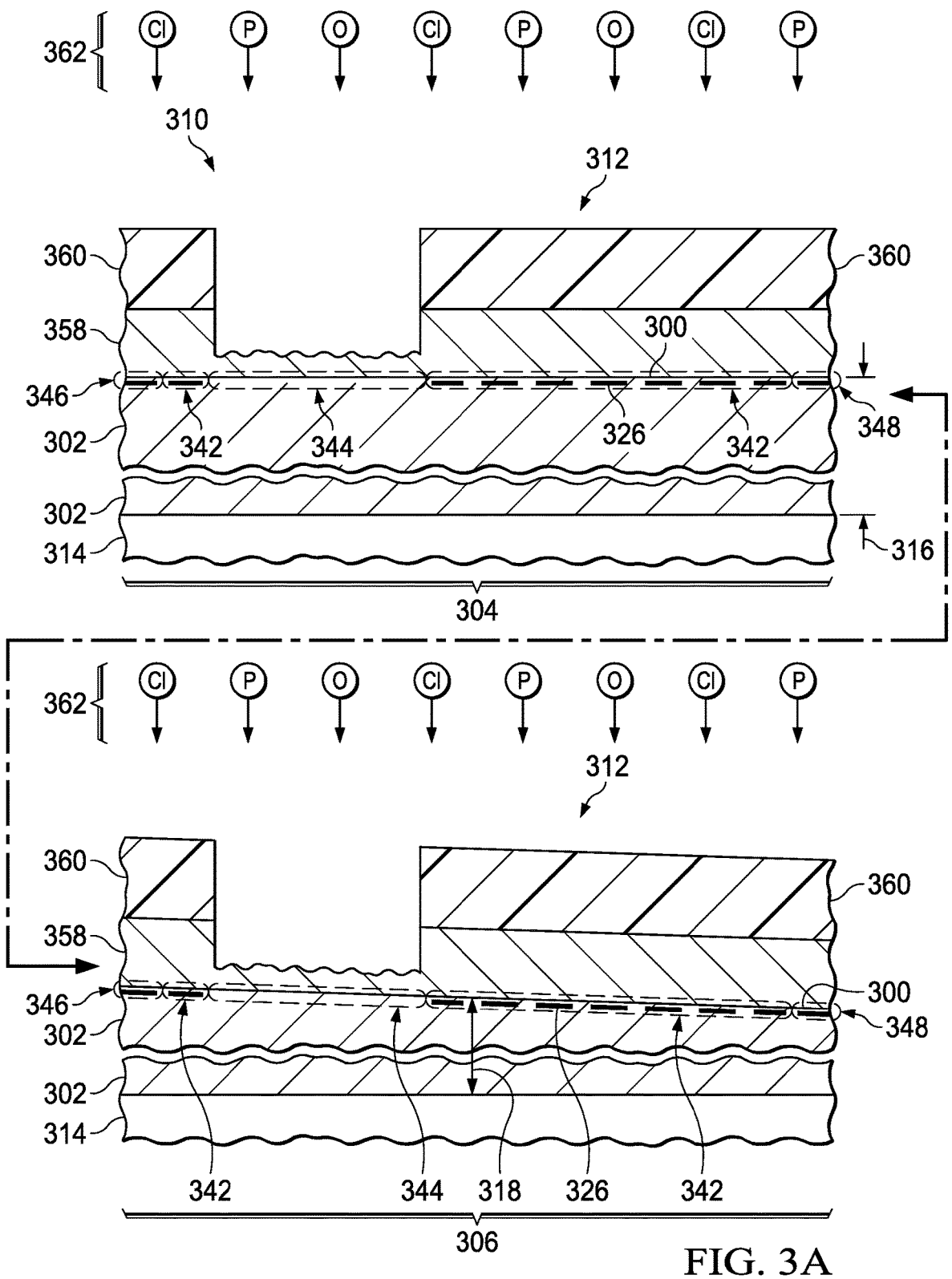
FIG. 3A through FIG. 3F are cross sections of another example semiconductor device that includes a GaN FET, depicted in stages of another example method of formation.

FIG. 3A through FIG. 3F are cross sections of another example semiconductor device 310 that includes a GaN FET 312, depicted in stages of another example method of formation. In this example, the GaN FET 312 is described as an enhancement mode GaN FET. Referring to FIG. 3A, the semiconductor device 310 is formed on a silicon substrate 314. The silicon substrate 314 may be implemented according to any of the examples disclosed in reference to FIG. 2A. A buffer layer 302 is formed over the silicon substrate 314 by a vapor epitaxial process, as disclosed in reference to the buffer layer 202 of FIG. 2A. Referring back to FIG. 3A, the buffer layer 302 has a top surface 300 located opposite from a boundary plane between the silicon substrate 314 and the buffer layer 302. The buffer layer 302 includes a columnar region 304 and a transition region 306. The columnar region 304 has a first average buffer thickness 316, and the transition region 306 has a second average buffer thickness 318. The first average buffer thickness 316 is greater than the second average buffer thickness 318, as disclosed in reference to the buffer layer 202 of FIG. 2A. The top surface 300 of the buffer layer 302 in the columnar region 304 may have a peak slope less than 0.1 percent, over a lateral distance of at least a micron, while the top surface 300 of the buffer layer 302 in the transition region 306 may have a peak slope of 0.5 percent to 2.0 percent, over a lateral distance of at least a micron.

Figure 3B:
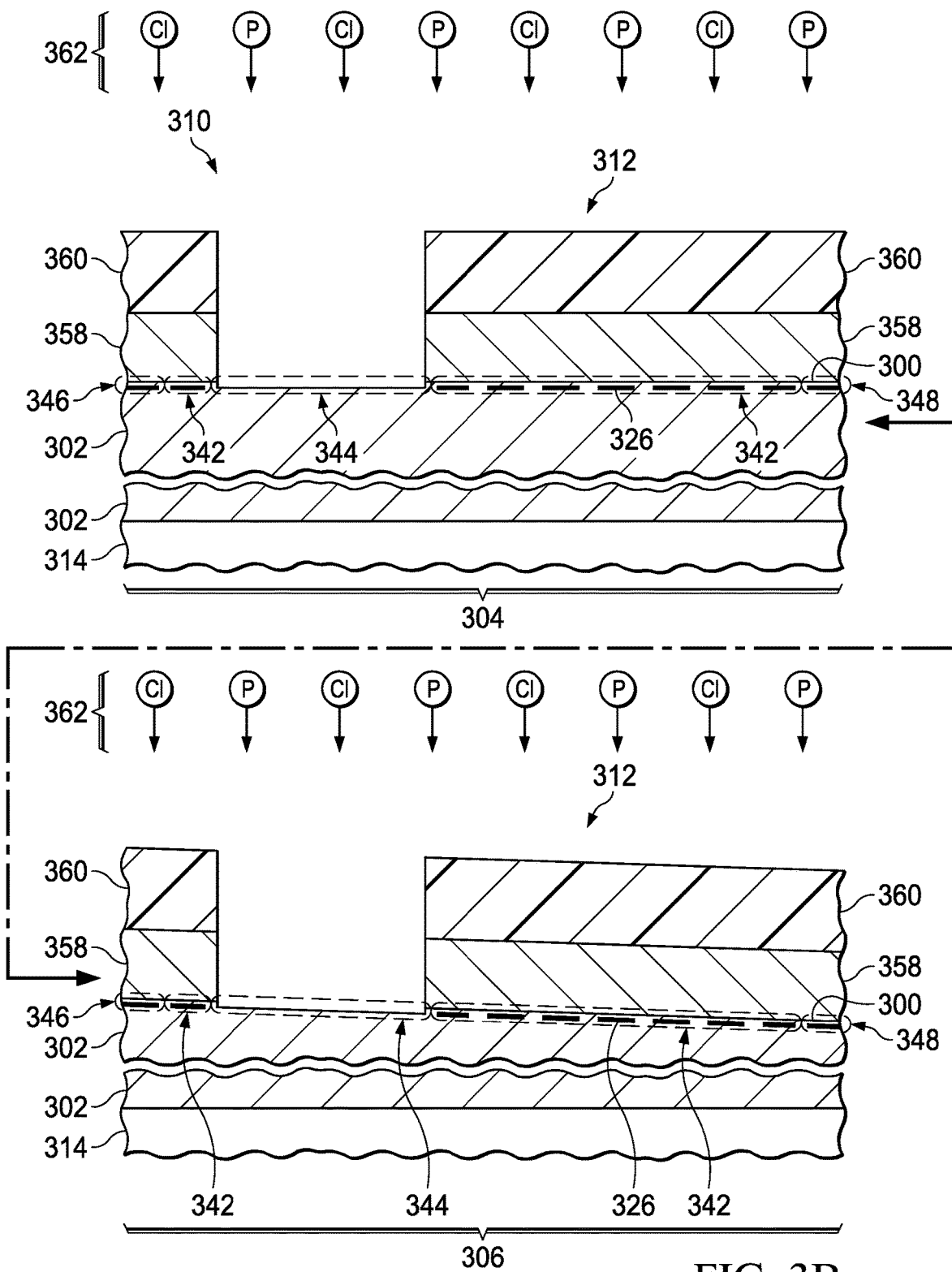
Figure 3C:
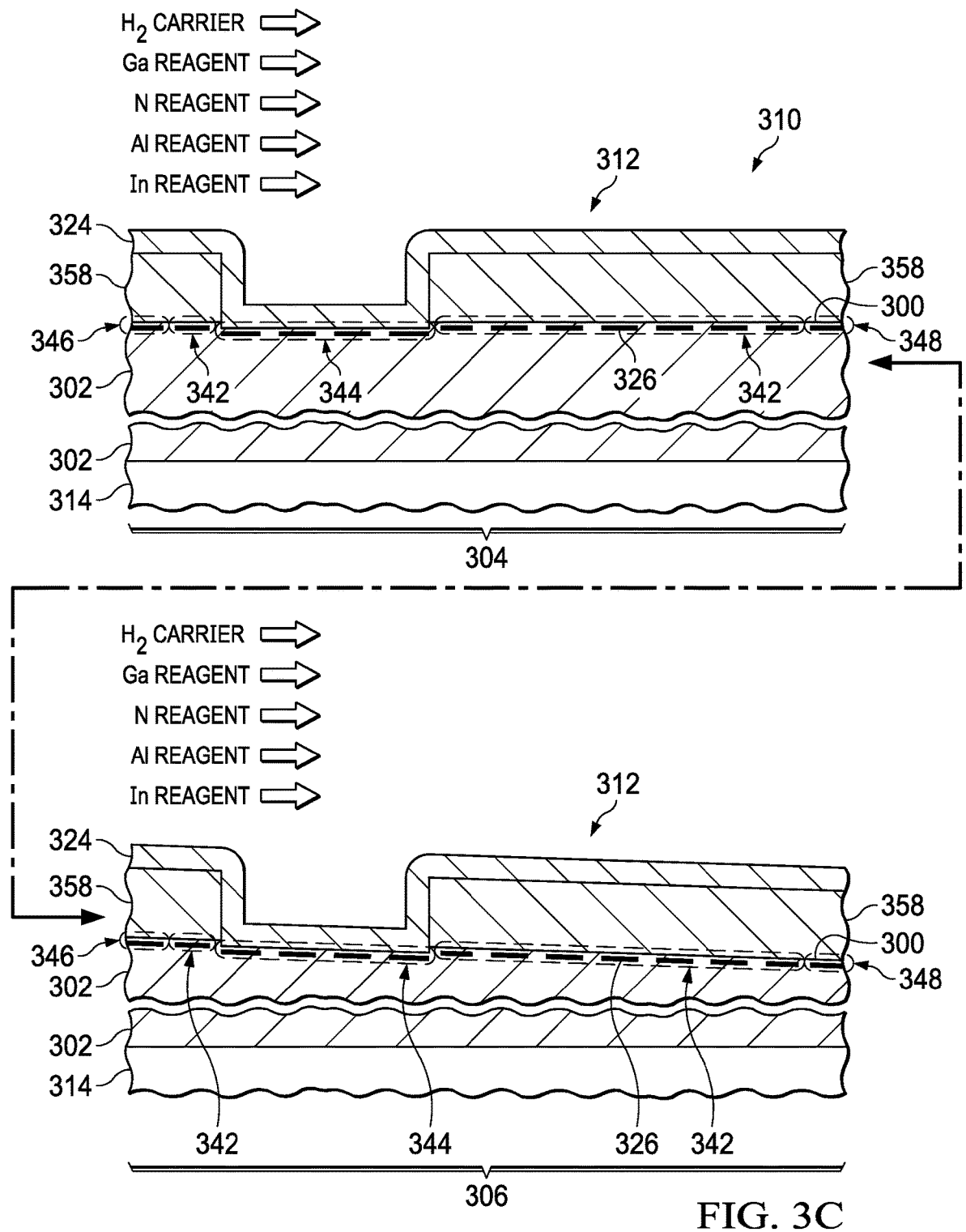
Figure 3D:
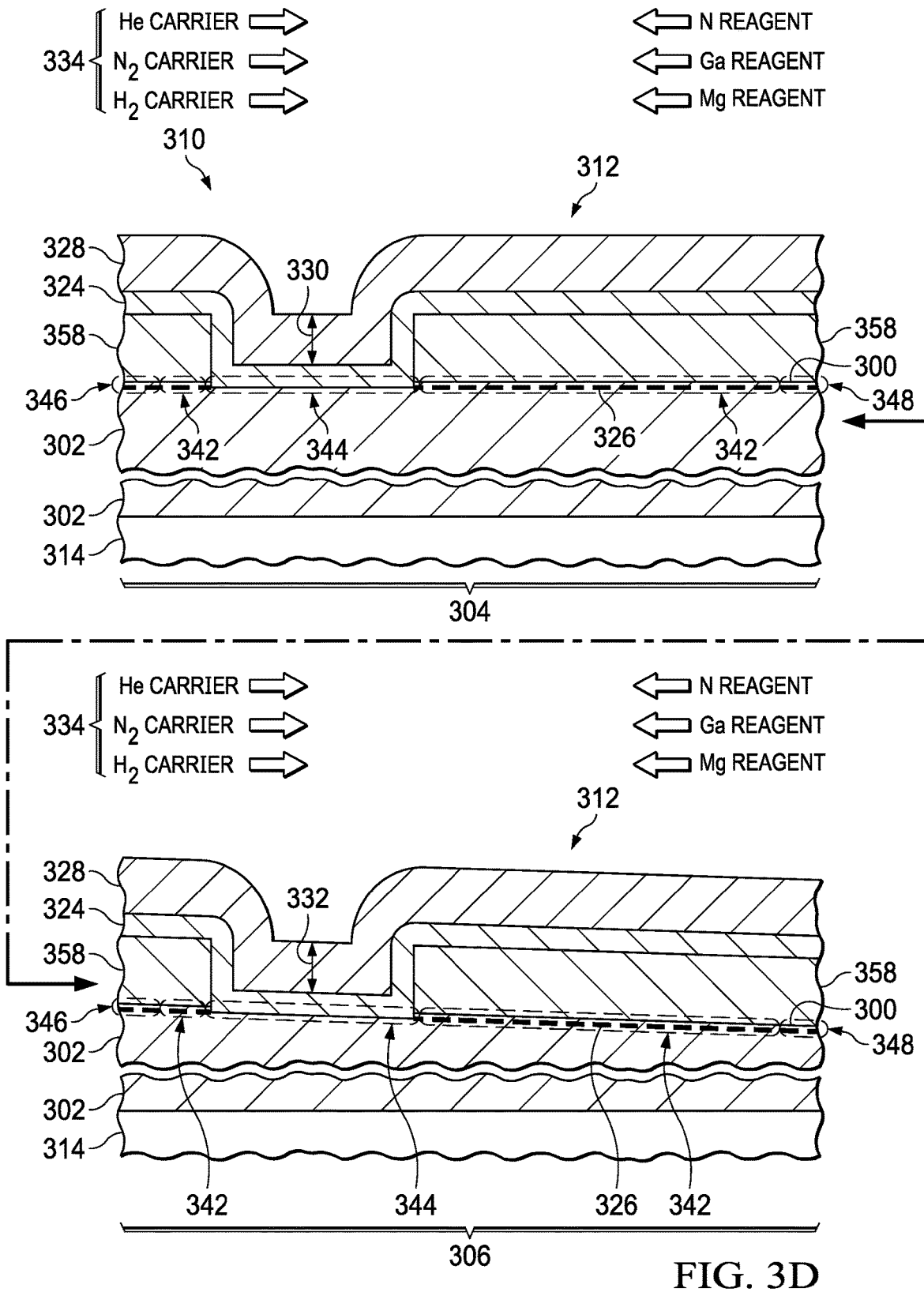
Figure 3E:
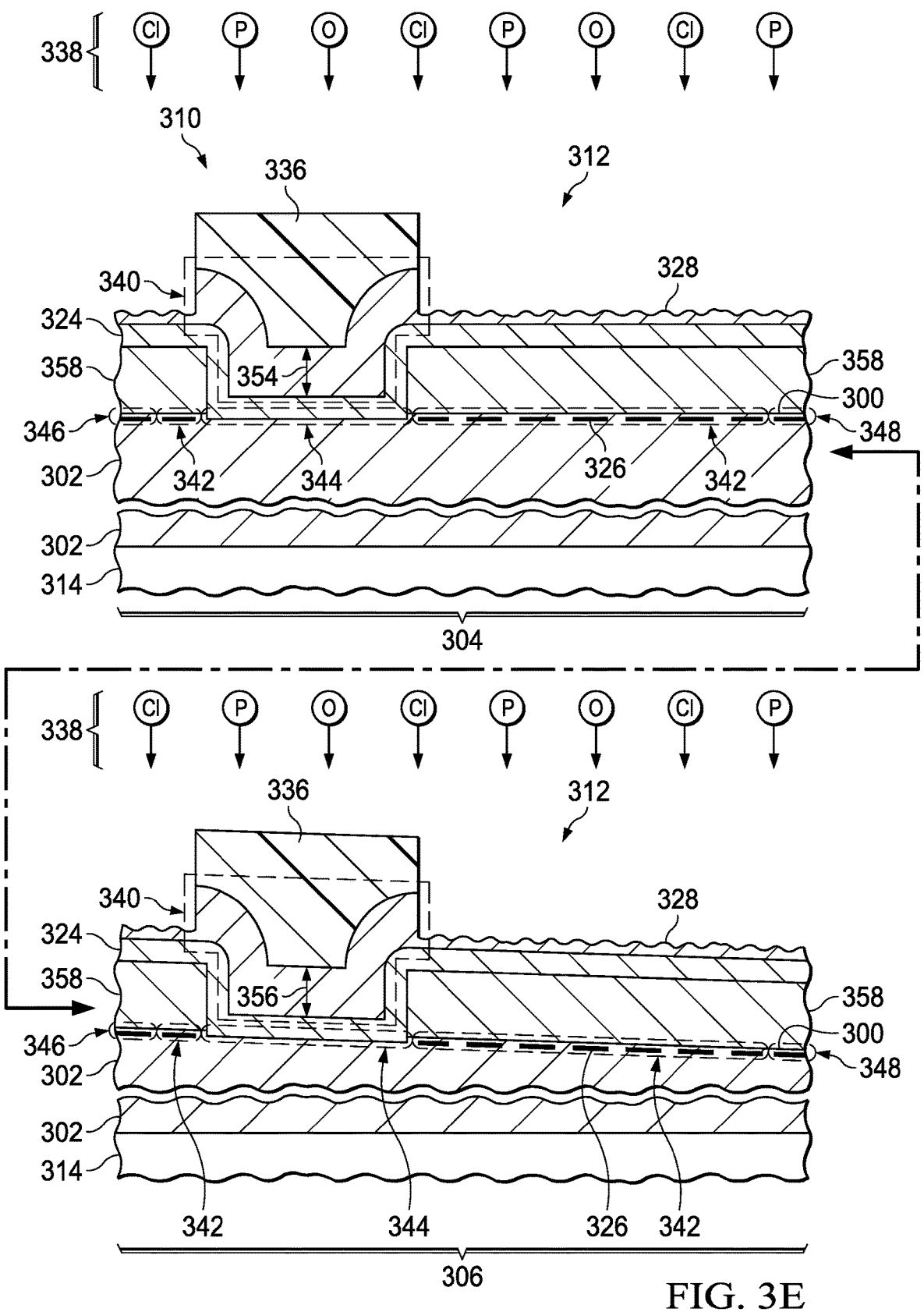
Figure 3F:
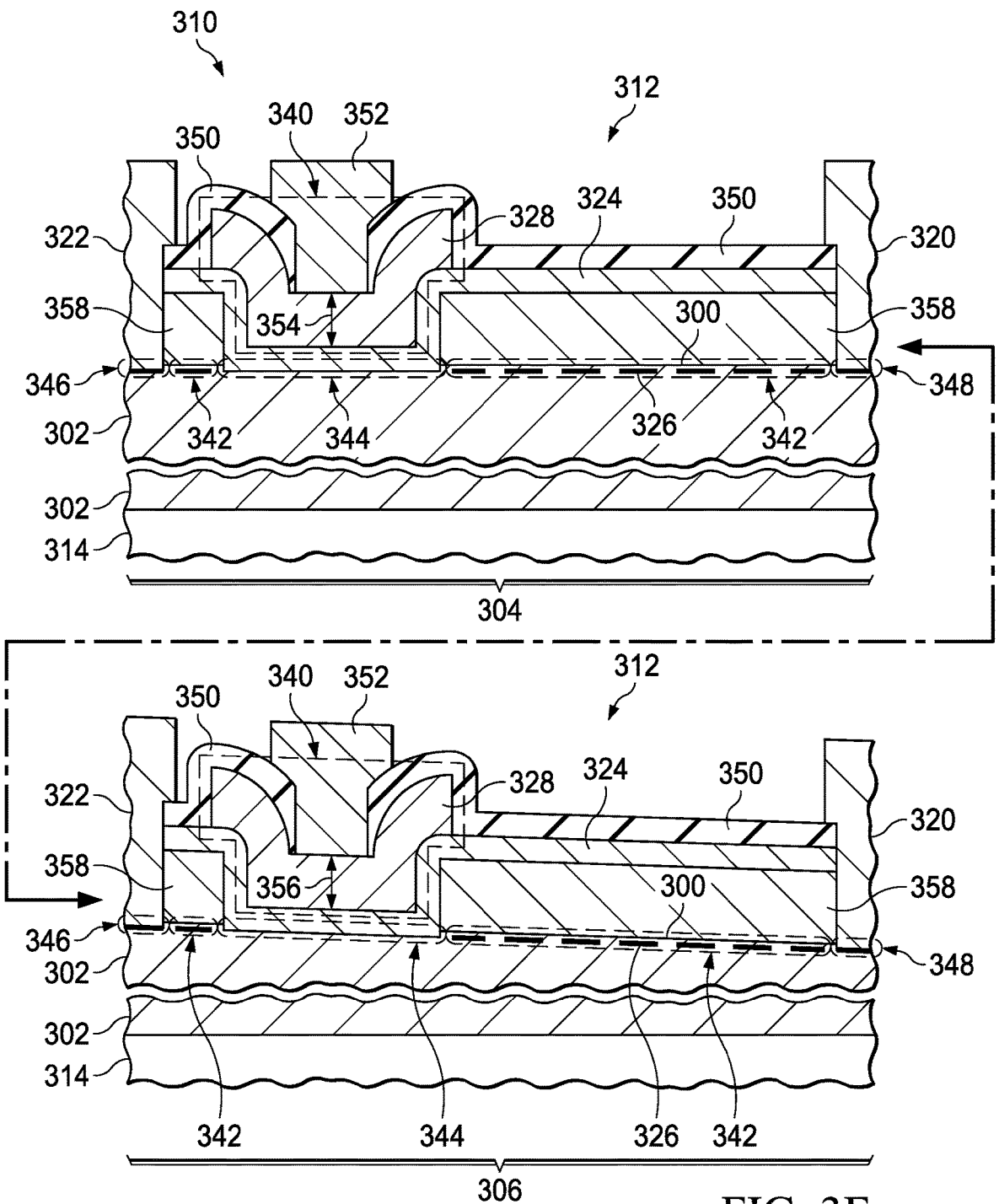

The GaN FET 312 of this example includes multiple fingers, with each finger extending from a drain contact 320 to a source contact 322 shown in FIG. 3F. FIG. 3A through FIG. 3F depict a first finger of the GaN FET 312 extending along the columnar region 304, and a second finger of the GaN FET 312 extending along the transition region 306. The GaN FET 312 may further extend over an inter-columnar region, not shown, of the buffer layer 302. Referring back to FIG. 3A, the first finger of the GaN FET 312 and the second finger of the GaN FET 312 may each extend a lateral distance of 5 microns to 10 microns, by way of example. The top surface 300 in the columnar region 304 may have a vertical range in the first finger of the GaN FET 312 that is less than 10 nanometers. The top surface 300 in the transition region 306 in the second finger of the GaN FET 312 may have a vertical range greater than 25 nanometers. Because the vertical range is greater in the transition region 306, the top surface 300 in the transition region 306 has a higher portion of surfaces off of the c-plane than the top surface 300 in the columnar region 304. Forming the buffer layer 302 over the silicon substrate 314 by the vapor phase epitaxial process may advantageously provide a lower cost for the semiconductor device 310 compared to other methods.

An access region barrier sublayer 358 of III-N semiconductor material is formed over the buffer layer 302 by a vapor epitaxial process. The access region barrier sublayer 358 includes aluminum and nitrogen, and may have a stoichiometry similar to the stoichiometry of the barrier layer 224, disclosed in reference to FIG. 2B.

The access region barrier sublayer 358 stresses the buffer layer 302 at the top surface 300, generating a quantum well in the buffer layer 302, just under the top surface 300, which accumulates free electrons to provide a two-dimensional electron gas (2DEG) 326 of the GaN FET 312. The 2DEG 326 extends through a channel region 344 under a subsequently-formed gate 340; the gate 340 is shown in FIG. 3E. The 2DEG 326 further extends through access regions 342 adjacent to the channel region 344, through a source region 346 and through a drain region 348. The source region 346 and the drain region 348 are located at opposite ends of each finger of the GaN FET 312, and are adjacent to the access regions 342. The access region barrier sublayer 358 may have a thickness of 10 nanometers to 50 nanometers, which, combined with the stoichiometry of the access region barrier sublayer 358, may provide a desired free charge carrier density in the 2DEG 326. The access region barrier sublayer 358 may be formed by a barrier sublayer MOVPE process. The barrier sublayer MOVPE process may be similar to the barrier MOVPE process disclosed in reference to FIG. 2B.

A gate recess mask 360 is formed over the access region barrier sublayer 358. The gate recess mask 360 exposes the access region barrier sublayer 358 in regions for a gate recess which overlaps regions for the subsequently-formed gate 340. The gate recess mask 360 may have a composition similar to the gate mask 236 of FIG. 2E, and may be formed by a similar process.

The access region barrier sublayer 358 is removed where exposed by the gate recess mask 360, by a gate recess etch process 362. The gate recess etch process 362 may be performed in an ICP etcher, using a chemical etchant species and a physical etchant species. The chemical etchant species may be implemented as chlorine radicals, labeled "Cl" in FIG. 3A, or bromine radicals. The physical etchant species may be implemented as fluorine ions, noble gas ions, or oxygen ions, as disclosed in reference to the gate etch process 238 of FIG. 2F. The physical etchant species is labeled "P" in FIG. 3A. The chemical etchant species and the physical etchant species may be provided by reagents disclosed in reference to the gate etch process 238 of FIG. 2F. In one version of this example, the gate recess etch process 362 may use optical emission spectroscopy (OES) to monitor an aluminum emission at a wavelength of 396.1 nanometers, to estimate complete removal of the access region barrier sublayer 358. In another version, the gate recess etch process 362 may be performed as a timed etch process. FIG. 3A depicts the gate recess etch process 362 partway to completion. As the access region barrier sublayer 358 is removed from over the channel region 344 by the gate recess etch process 362, the free charge carrier density in the 2DEG 326 decreases in the channel region 344, because the stress on the buffer layer 302 at the top surface 300 is reduced.

Referring to FIG. 3B, the gate recess etch process 362 is continued until the access region barrier sublayer 358 is removed from over the channel region 344, exposing the buffer layer 302. A small amount of the buffer layer 302, up to about 3 nanometers, may be removed by the gate recess etch process 362. The free charge carrier density in the 2DEG 326 in the channel region 344 may decrease to zero, as indicated in FIG. 3B.

The gate recess mask 360 is subsequently removed, leaving the access region barrier sublayer 358 in place over the access regions 342. The access region barrier sublayer 358 is part of the GaN FET 312. The gate recess mask 360 may be removed by a process similar to the process disclosed in reference to FIG. 2G for removal of the gate mask 236.

The top surface 300 of the buffer layer 302 in the transition region 306 over the channel region 344 retains the slope that was present before the gate recess etch process 362 was performed, that is, a slope of 0.5 percent to 2.0 percent. Similarly, the top surface 300 of the buffer layer 302 in the columnar region 304 retains the slope that was present before the gate recess etch process 362 was performed, that is, a slope less than 0.1 percent. Thus, the top surface 300 of the buffer layer 302 in the transition region 306 over the channel region 344 has a higher portion of surfaces off of the c-plane than the top surface 300 of the buffer layer 302 in the columnar region 304 over the channel region 344.

Referring to FIG. 3C, a barrier layer 324 of III-N semiconductor material is formed over the access region barrier sublayer 358 and over the buffer layer 302 where exposed by the access region barrier sublayer 358. The barrier layer 324 is part of the GaN FET 312.

The barrier layer 324 includes aluminum and nitrogen, and may include gallium, indium, or other group III element. The barrier layer 324 has an aluminum content of at least 25 atomic percent. The barrier layer 324 may have a different stoichiometry or thickness than the stoichiometry and thickness disclosed for the barrier layer 224 in reference to FIG. 2B. The barrier layer 324 stresses the buffer layer 302 at the top surface 300, generating a quantum well in the buffer layer 302, just under the top surface 300, in the channel region 344, which accumulates free electrons to in the 2DEG 326. The stoichiometry and thickness of the barrier layer 324 may be selected to provide a desired threshold potential for the GaN FET 312, while the access region barrier sublayer 358 induces a higher free charge carrier density in the 2DEG 326 in the access regions 342 to provide a desired resistance for the GaN FET 312.

The barrier layer 324 may be formed by a barrier MOVPE process using an aluminum-containing gas reagent and a nitrogen-containing gas reagent, labeled "Al REAGENT" and "N REAGENT" respectively, in FIG. 3C. In versions of this example in which the barrier layer 324 includes gallium or indium, the barrier MOVPE process uses a gallium-containing gas reagent, labeled "Ga REAGENT" or an indium-containing gas reagent, labeled "In REAGENT" in FIG. 3C. The barrier MOVPE process uses a carrier gas containing hydrogen, labeled "$H_2$ CARRIER" in FIG. 3C. The buffer layer 302 may be heated to 900° C. to 1100° C. during the barrier MOVPE process.

The barrier layer 324 over the channel region 344 in the transition region 306 may have a similar slope as the top surface 300 in the transition region 306, that is, a slope of 0.5 percent to 2.0 percent. Similarly, the barrier layer 324 over the channel region 344 in the columnar region 304 may have a similar slope as the top surface 300 in the columnar region 304, that is, a slope less than 0.1 percent. Thus, the barrier layer 324 in the transition region 306 has a higher portion of surfaces off of the c-plane than the columnar region 304.

In an alternate version of this example, the barrier layer 324 may be formed prior to forming the access region barrier sublayer 358. In cases of this alternate version in which the stoichiometry of the access region barrier sublayer 358 is close to the stoichiometry of the barrier layer 324, the access region barrier sublayer 358 may be etched by a timed etch process, because endpointing may be unreliable. In cases of this alternate version in which an aluminum content of the access region barrier sublayer 358 is less than the aluminum content of the barrier layer 324, the access region barrier sublayer 358 may be etched by a selective etch process in an ICP reactor, similar to the gate etch process 238 disclosed in reference to FIG. 2F and FIG. 2G. In cases of this alternate version in which an aluminum content of the access region barrier sublayer 358 is greater than the aluminum content of the barrier layer 324, etching the access region barrier sublayer 358 may be endpointed by using OES to monitor the aluminum emission at a wavelength of 396.1 nanometers, as disclosed in reference to the gate recess etch process 362 of FIG. 3A.

Referring to FIG. 3D, a gate layer 328 is formed of III-N semiconductor material by a gate MOVPE process over the barrier layer 324. The gate layer 328 may have a stoichiometry similar to the stoichiometry disclosed for the gate layer 228 in reference to FIG. 2D. The gate layer 328 has a first gate layer thickness 330 over the channel region 344 in the columnar region 304 and a second gate layer thickness 332 over the channel region 344 in the transition region 306. The first gate layer thickness 330 and the second gate layer thickness 332 are both greater than twice the vertical range of the top surface 300 of the buffer layer 302 in the columnar region 304. The first gate layer thickness 330 and the second gate layer thickness 332 may be 40 nanometers to 100 nanometers, by way of example. A difference between the first gate layer thickness 330 and the second gate layer thickness 332 is less than half of the vertical range of the top surface 300 of the buffer layer 302 in the columnar region 304. The gate layer 328 reduces the free charge carrier density in the 2DEG 326 in the channel region 344 to zero, as a result of the work function of the gate layer 328 reducing the quantum well in the channel region 344.

The gate MOVPE process uses a carrier gas 334 that may include nitrogen gas, labeled "$N_2$ CARRIER" in FIG. 3D, hydrogen gas, labeled "$H_2$ CARRIER" in FIG. 3D, and a noble gas, such as helium gas, labeled "He CARRIER" in FIG. 3D, as disclosed in reference to the gate MOVPE process of FIG. 2D. The hydrogen gas content is 0 percent to 40 percent, by volumetric flow rate, of the carrier gas 334.

The gate MOVPE process uses a gallium-containing gas reagent, labeled "Ga REAGENT" in FIG. 3D, and a nitrogen-containing gas reagent, labeled "N REAGENT" in FIG. 3D, as disclosed in reference to the gate MOVPE process of FIG. 2D. The gate MOVPE process may incorporate p-type dopants into the gate layer 328, using a magnesium-containing gas reagent, labeled "Mg REAGENT" in FIG. 3D, to provide the magnesium in the gate layer 328. The gate layer 328 may optionally include aluminum or indium; the gate MOVPE process may use an aluminum-containing gas reagent or an indium-containing gas reagent, not shown in FIG. 3D.

The gate MOVPE process may be performed in a temperature range and pressure range as disclosed in reference to the gate MOVPE process of FIG. 2D. Use of the nitrogen gas or the noble gas in the carrier gas 334 may provide improved uniformity in the gate layer 328 across the silicon substrate 314, particularly in the columnar region 304 and in the transition region 306, as explained in reference to FIG. 2D. Growth of the III-N semiconductor material may be temporarily interrupted after forming the barrier layer 324 and prior to forming the gate layer 328, by a growth interruption, as disclosed in reference to FIG. 2C.

Referring to FIG. 3E, a gate mask 336 is formed over the gate layer 328. The gate mask covers an area of the gate layer 328 for a gate 340 of the GaN FET 312. The gate mask 336 may include photoresist or hard mask material, as disclosed in reference to the gate mask 236 of FIG. 2E. A gate etch process 338 removes the gate layer 328 where exposed by the gate mask 336, leaving the gate layer 328 under the gate mask 336 to form the gate 340. The gate etch process 338 may be performed in an ICP etcher, using a chemical etchant species, labeled "Cl" in FIG. 3E, a physical etchant species, labeled "P" in FIG. 3E, and an aluminum passivating species, labeled "O" in FIG. 3E, as disclosed in reference to the gate etch process 238 of FIG. 2F. The gate etch process 338 may remove the gate layer 328 completely where exposed by the gate mask 336, without removing a significant amount of the barrier layer 324. FIG. 3E depicts the gate etch process 338 partway to completion. The gate etch process 338 is continued until the gate layer 328 is removed outside of the gate 340, and may be continued in an overetch step, as disclosed in reference to the gate etch process 238 of FIG. 2F.

As the gate layer 328 is removed, the free charge carrier density in the 2DEG 326 increases in the access regions 342, because the thickness of the gate layer 328 is decreasing outside of the gate 340. The channel region 344 remains free of free charges below the gate 340, because the thickness of the gate layer 328 remains constant in the gate 340. The free charge carrier density in the access regions 342 may increase to a value comparable to the free charge carrier density before the gate layer 328 was formed.

The gate mask 336 is subsequently removed. The gate mask 336 may be removed by any of the processes disclosed in reference to removal of the gate mask 236 of FIG. 2G.

The gate 340 has a first gate thickness 354 over the columnar region 304 and a second gate thickness 356 over the transition region 306. Both the first gate thickness 354 and the second gate thickness 356 are greater than twice the vertical range of the top surface 300 of the buffer layer 302 in the columnar region 304. Both the first gate thickness 354 and the second gate thickness 356 may be 40 nanometers to 100 nanometers thick. A difference between the first gate thickness 354 and the second gate thickness 356 is less than the vertical range of the top surface 300 of the buffer layer 302 in the columnar region 304.

Referring to FIG. 3F, a dielectric layer 350 may be formed over the barrier layer 324 adjacent to the gate 340. The dielectric layer 350 may have a composition similar to the dielectric layer 250 of FIG. 2H, and may be formed by a process similar to the process used to form the dielectric layer 250. The dielectric layer 350 may provide the advantages disclosed in reference to the dielectric layer 250.

A gate contact 352 is formed through the dielectric layer 350, contacting the gate 340. A source contact 322 is formed through the dielectric layer 350, the barrier layer 324 and the access region barrier sublayer 358, contacting the 2DEG 326 at the source region 346. The drain contact 320 is formed through the dielectric layer 350, the barrier layer 324 and the access region barrier sublayer 358, contacting the 2DEG 326 at the drain region 348. In this example, the gate contact 352, the source contact 322, and the drain contact 320 may extend partway over the dielectric layer 350, as depicted in FIG. 3F. The gate contact 352, the source contact 322, and the drain contact 320 are electrically conductive, and may include one or more metals, such as titanium, tungsten, or aluminum, or may include other electrically conductive material such as carbon nanotubes or graphene.

The gate contact 352 may be formed by removing the dielectric layer 350 from an area for the gate contact 352, exposing the gate 340. The source contact 322 and the drain contact 320 may be formed by removing the dielectric layer 350, the barrier layer 324 and the access region barrier sublayer 358, in areas for the source contact 322 and the drain contact 320, exposing the source region 346 and the drain region 348. A contact layer, not shown, of electrically conductive material is formed over the dielectric layer 350, extending into the areas where the dielectric layer 350, the barrier layer 324 and the access region barrier sublayer 358 were removed, and contacting the gate 340, the source region 346, and the drain region 348. A contact mask, not shown, may be formed over the contact layer, covering the areas for the gate contact 352, the source contact 322, and the drain contact 320. The contact layer is removed by a contact etch process, where exposed by the contact mask, leaving the contact layer under the contact mask to provide the gate contact 352, the source contact 322, and the drain contact 320. The contact mask may be subsequently removed. Alternatively, the gate contact 352, the source contact 322, and the drain contact 320 may be formed by a lift-off process, in which a lift-off layer of photoresist is formed after removing the dielectric layer 350, the barrier layer 324 and the access region barrier sublayer 358, in areas for the gate contact 352, the source contact 322 and the drain contact 320. The contact layer is formed over the lift-off layer, extending into the areas where the dielectric layer 350, the barrier layer 324 and the access region barrier sublayer 358 were removed, and contacting the gate 340, the source region 346, and the drain region 348. The lift-off layer is subsequently removed by a solvent process, concurrently removing the contact layer over the lift-off layer, leaving the contact layer under the contact mask to provide the gate contact 352, the source contact 322, and the drain contact 320.

Operation of the GaN FET 312 may be similar to the operation of the GaN FET 212 disclosed in reference to FIG. 2H, accruing similar advantages. In this example, the access region barrier sublayer 358 may produce a higher free charge carrier density in the 2DEG 326 in the access regions 342, compared to a similar GaN FET lacking the access region barrier sublayer 358, advantageously providing a lower resistance for the GaN FET 312.

Various features of the examples disclosed herein may be combined in other manifestations of example semiconductor devices. For example, the GaN FET 212 of FIG. 2H may have an access region barrier sublayer similar to the access region barrier sublayer 358 of the GaN FET 312 of FIG. 3F. In another example, the GaN FET 212 of FIG. 2H may have the gate contact 252, the source contact 222, and the drain contact 220 extend partway over the dielectric layer 250, similar to the gate contact 352, the source contact 322, and the drain contact 320 of the GaN FET 312 of FIG. 3F. In a further example, the GaN FET 312 of FIG. 3F may have the gate contact 352, the source contact 322, and the drain contact 320 aligned with edges of the dielectric layer 350, similar to the gate contact 252, the source contact 222, and the drain contact 220 of the GaN FET 212 of FIG. 2H.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a silicon substrate;
   a buffer layer of III-N semiconductor material over the silicon substrate, wherein:
   the buffer layer includes a columnar region having a first thickness;
   the buffer layer includes a transition region surrounding the columnar region; and
   the buffer layer includes an inter-columnar region around the transition region, the inter-columnar region having a second thickness, the first thickness being greater than the second thickness; and
   the buffer layer has a (0001) crystal orientation, wherein a c-plane of the III-N semiconductor material of the buffer layer is parallel to a boundary plane between the buffer layer and the silicon substrate, and wherein a top surface in the inter-columnar region has a higher portion of surfaces off of the c-plane than a top surface in the columnar region; and
   a gallium nitride field effect transistor (GaN FET), including:
   a barrier layer of III-N semiconductor material over the buffer layer, the barrier layer extending across the columnar region and the transition region; and
   a gate of p-type III-N semiconductor material over the barrier layer, the gate extending over the columnar region and the transition region, wherein:
   the gate has a first gate thickness over the columnar region and a second gate thickness over the transition region;
   both the first gate thickness and the second gate thickness are thicker than twice a vertical range of the top surface in the columnar region; and
   a difference between the first gate thickness and the second gate thickness is less than half the vertical range of the top surface in the columnar region.

2. The semiconductor device of claim 1, wherein a difference between the first thickness and the second thickness is 50 nanometers to 200 nanometers.

3. The semiconductor device of claim 1, wherein the buffer layer has an average thickness of 5 microns to 10 microns.

4. The semiconductor device of claim 1, wherein:
   the vertical range of the top surface in the columnar region is 10 nanometers to 40 nanometers; and
   the vertical range of the top surface in the transition region extends from the columnar region to the inter-columnar region and is 50 nanometers to 200 nanometers.

5. The semiconductor device of claim 1, wherein the GaN FET includes an access region barrier sublayer of III-N semiconductor material over the buffer layer adjacent to the gate.

6. The semiconductor device of claim 1, wherein both the first gate thickness and the second gate thickness are 40 nanometers to 100 nanometers thick.

7. The semiconductor device of claim 1, wherein the columnar region and the inter-columnar region each extend a lateral distance of 5 microns to 10 microns.

8. The semiconductor device of claim 1, wherein the GaN FET is free of the III-N semiconductor material of the gate over the barrier layer adjacent to the gate.

9. The semiconductor device of claim 1, wherein the silicon substrate includes silicon with a (111) lattice orientation.

10. The semiconductor device of claim 1, wherein the first gate thickness is different than the second gate thickness.

11. A gallium nitride field effect transistor (GaN FET), comprising:
- a semiconductor substrate;
- a buffer layer of III-N semiconductor material over the semiconductor substrate, the buffer layer including a (0001) crystal orientation, a c-plane of the III-N semiconductor material of the buffer layer being parallel to a boundary plane between the buffer layer and the semiconductor substrate, wherein the buffer layer has:
  - a columnar region, wherein a top surface in the columnar region has a first portion of surfaces off of the c-plane;
  - a transition region connected to and surrounding the columnar region, wherein a top surface in the transition region has a second portion of surfaces off of the c-plane, the second portion greater than the first portion; and
  - an inter-columnar region connected to and surrounding the transition region, wherein a top surface in the inter-columnar region has a third portion of surfaces off of the c-plane, the third portion less than the second portion and greater than the first portion;
- a barrier layer of III-N semiconductor material on the buffer layer, the barrier layer extending across the columnar region and the transition region; and
- a gate layer of III-N semiconductor material on the barrier layer, the gate layer extending across the columnar region and the transition region.

12. The GaN FET of claim 11, wherein the gate layer has a first thickness over the columnar region and a second thickness over the transition region, the second thickness being different than the first thickness.

13. The GaN FET of claim 12, wherein the first and second thicknesses are greater than twice a vertical range of the top surface in the columnar region.

14. The GaN FET of claim 12, wherein a difference between the first and second thicknesses is less than half a vertical range of the top surface in the columnar region.

15. The GaN FET of claim 11, further including:
- a barrier sublayer of III-N semiconductor material over the buffer layer adjacent to the gate layer.

16. The GaN FET of claim 11, wherein the semiconductor substrate includes silicon with a (111) lattice orientation.

17. The GaN FET of claim 11, wherein the columnar region has a substantially circular shape parallel to a boundary plane between the buffer layer and the semiconductor substrate.

* * * * *